(12) United States Patent
Kubouchi

(10) Patent No.: US 11,756,868 B2
(45) Date of Patent: Sep. 12, 2023

(54) SEMICONDUCTOR DEVICE AND METHOD FOR MANUFACTURING THE SAME

(71) Applicant: FUJI ELECTRIC CO., LTD., Kawasaki (JP)

(72) Inventor: Motoyoshi Kubouchi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 138 days.

(21) Appl. No.: 17/039,636

(22) Filed: Sep. 30, 2020

(65) Prior Publication Data

US 2021/0134710 A1 May 6, 2021

(30) Foreign Application Priority Data

Nov. 6, 2019 (JP) .................................. 2019-201559

(51) Int. Cl.
*H01L 23/498* (2006.01)
*H01L 25/18* (2023.01)
(Continued)

(52) U.S. Cl.
CPC .... *H01L 23/49811* (2013.01); *H01L 21/4853* (2013.01); *H01L 23/3107* (2013.01);
(Continued)

(58) Field of Classification Search
CPC ........... H01L 23/49811; H01L 21/4853; H01L 25/072
See application file for complete search history.

(56) References Cited

U.S. PATENT DOCUMENTS

| 5,841,189 A * | 11/1998 | Shitama .................. H01L 21/50 257/734 |
| 2010/0027228 A1 | 2/2010 | Tsukada et al. |

(Continued)

FOREIGN PATENT DOCUMENTS

| CN | 101399242 A * | 4/2009 | ........... H01L 25/072 |
| JP | 2004228403 A | 8/2004 | |

(Continued)

OTHER PUBLICATIONS

Japanese Patent Office Action dated Feb. 18, 2020 for Japanese Patent Application No. 2019-201559.

*Primary Examiner* — Michele Fan
(74) *Attorney, Agent, or Firm* — Rabin & Berdo, P.C.

(57) ABSTRACT

A semiconductor device, including a semiconductor module and a conducting board. The semiconductor module includes a semiconductor chip and an external connecting terminal which has a first end electrically connected to the semiconductor chip and a second end extending from the semiconductor chip. The conducting board has a terminal hole penetrating therethrough, an inlet and an outlet of the terminal hole being respectively on two opposite surfaces of the conducting board. The conducting board is electrically connected to the external connecting terminal, of which the second end fits into the terminal hole from the inlet toward the outlet, and is fixed therein by solder. At least one of the terminal hole and the second end of the external connecting terminal has a lock part. The second end of the external connecting terminal, inserted into the terminal hole, is locked by the lock part and thereby remains in the terminal hole.

18 Claims, 23 Drawing Sheets

(51) Int. Cl.
   *H01L 21/48* (2006.01)
   *H01L 23/31* (2006.01)
(52) U.S. Cl.
   CPC .. *H01L 23/49822* (2013.01); *H01L 23/49833* (2013.01); *H01L 25/18* (2013.01)

(56) References Cited

U.S. PATENT DOCUMENTS

| | | | | |
|---|---|---|---|---|
| 2010/0127383 | A1* | 5/2010 | Oka | H01L 25/072 |
| | | | | 257/692 |
| 2016/0143187 | A1* | 5/2016 | Sekino | H01L 23/40 |
| | | | | 29/832 |
| 2016/0219705 | A1* | 7/2016 | Bayerer | H05K 1/0262 |
| 2016/0233146 | A1 | 8/2016 | Nakamura | |
| 2017/0263535 | A1 | 9/2017 | Nakano et al. | |
| 2018/0114735 | A1* | 4/2018 | Nakamura | H01L 23/3121 |
| 2018/0338376 | A1 | 11/2018 | Terashima | |

FOREIGN PATENT DOCUMENTS

| | | | | | |
|---|---|---|---|---|---|
| JP | 2005353774 | A | | 12/2005 | |
| JP | 2006186144 | A | | 7/2006 | |
| JP | 2009064852 | A | | 3/2009 | |
| JP | 2010041053 | A | | 2/2010 | |
| JP | 2010212311 | A | | 9/2010 | |
| JP | 2011142124 | A | | 7/2011 | |
| JP | 2011233753 | A | * | 11/2011 | ......... H01L 23/3107 |
| JP | 2016164825 | A | | 9/2016 | |
| JP | 2017163016 | A | | 9/2017 | |
| JP | 2018195714 | A | | 12/2018 | |
| WO | 2008093549 | A1 | | 8/2008 | |
| WO | 2015151235 | A1 | | 10/2015 | |

* cited by examiner

SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2019-201559, filed on Nov. 6, 2019, the entire contents of which are incorporated herein by reference.

BACKGROUND OF THE INVENTION

1. Field of the Invention

The embodiments discussed herein relate to a semiconductor device and method for manufacturing the semiconductor device.

2. Background of the Related Art

A semiconductor module includes semiconductor chips, such as insulated gate bipolar transistors (IGBTs) and power metal oxide semiconductor field effect transistors (MOSFETs), and has a plurality of pin-shaped external connecting terminals extending perpendicularly from the front surface. Inside the semiconductor module, the external connecting terminals are electrically connected to control electrodes and main electrodes of the semiconductor chips. A semiconductor device is equipped with a plurality of such semiconductor modules, and includes printed boards or busbars affixed to the external connecting terminals of the individual semiconductor modules. Herewith, the semiconductor device functions, for example, as a power converter.

Japanese Laid-open Patent Publication No. 2011-142124
Japanese Laid-open Patent Publication No. 2017-163016

In the above semiconductor device, the external connecting terminals protrude from the printed boards. That is, space needs to be provided directly above the front surface of the semiconductor device to accommodate the protruding external connecting terminals. For this reason, it is not allowed to place an insulating sheet and the like directly above the front surface of the semiconductor device. In addition, in the case of placing different devices directly above the front surface of the semiconductor device, space needs to be left for the protruding parts of the external connecting terminals. Further, because of the demand for such space, the semiconductor device has limited flexibility in installation depending on its installation place.

SUMMARY OF THE INVENTION

According to an aspect, there is provided a semiconductor device, including a semiconductor module, including a semiconductor chip and an external connecting terminal which has a first end electrically connected to the semiconductor chip and a second end extending from the semiconductor chip; and a conducting board configured to have a terminal hole penetrating therethrough, an inlet and an outlet of the terminal hole being respectively on two opposite surfaces of the conducting board, the conducting board being electrically connected to the external connecting terminal, of which the second end fits into the terminal hole from the inlet toward the outlet, and is fixed therein by solder, wherein at least one of the terminal hole and the second end of the external connecting terminal has a lock part, and the second end of the external connecting terminal, inserted into the terminal hole, is locked by the lock part and thereby remains in the terminal hole.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings. Note that in the following the terms "front surface" and "upper surface" refer to surfaces facing upward in a semiconductor module 10 of FIG. 1. Similarly, the term "upper" refers to the upward direction of the semiconductor module 10 of FIG. 1. On the other hand, the terms "rear surface" and "lower surface" refer to surfaces facing downward in the semiconductor module 10 of FIG. 1. Similarly, the term "lower" refers to the downward direction of the semiconductor module 10 of FIG. 1. These terms have the same orientational relationship in other drawings if needed. The terms "front surface", "upper surface", "upper", "rear surface", "lower surface", "lower", and "side" are simply expedient expressions used to specify relative positional relationships, and are not intended to limit the technical ideas of the embodiments described herein. For example, the terms "upper" and "lower" do not necessarily imply the vertical direction to the ground surface. That is, the "upper" and "lower" directions are not defined in relation to the direction of the gravitational force.

Figure 1:
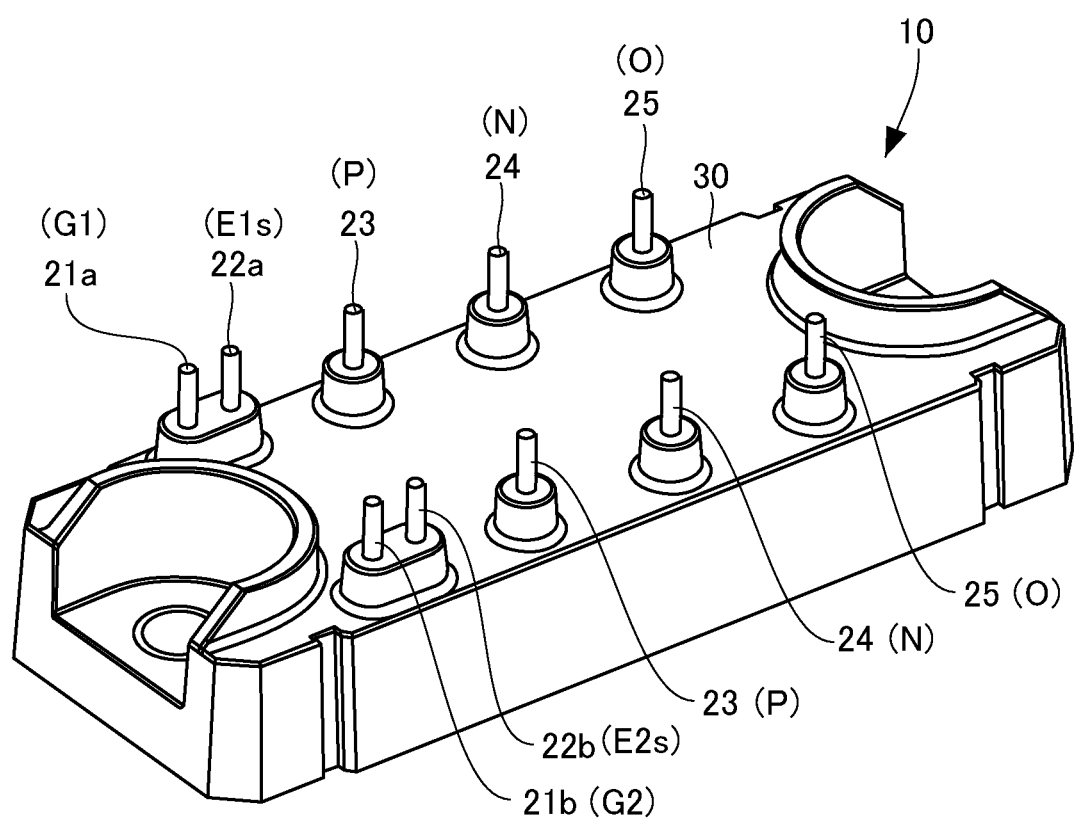
FIG. 1 is a first perspective view of an exterior of a semiconductor module.
Figure 2:
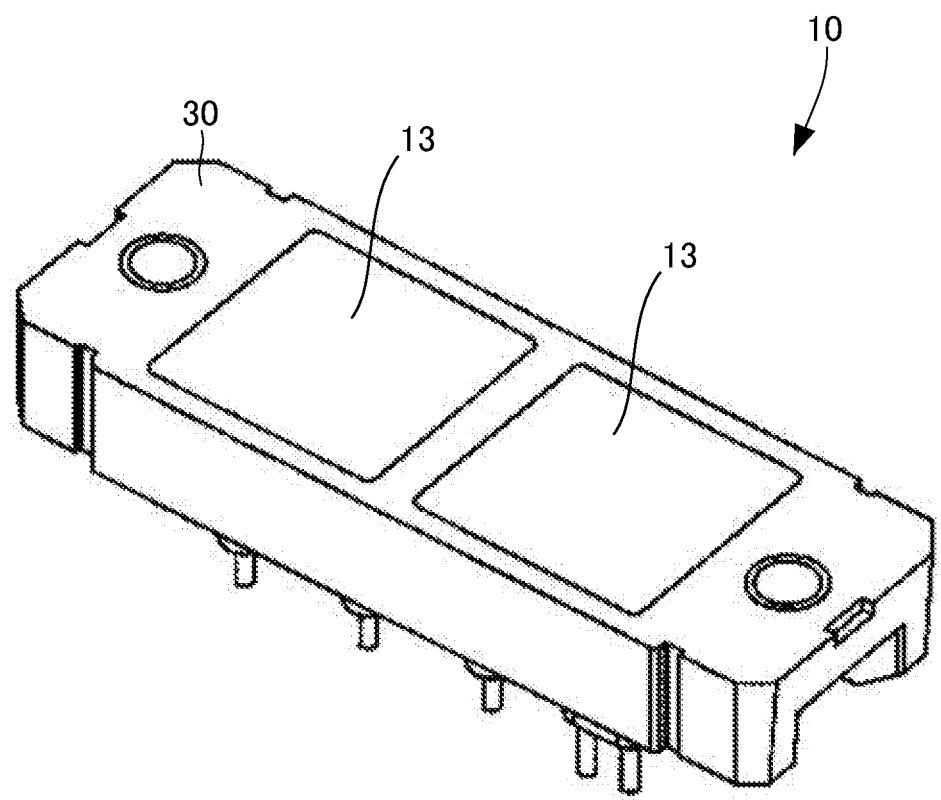
FIG. 2 is a second perspective view of the exterior of the semiconductor module.
Figure 3:
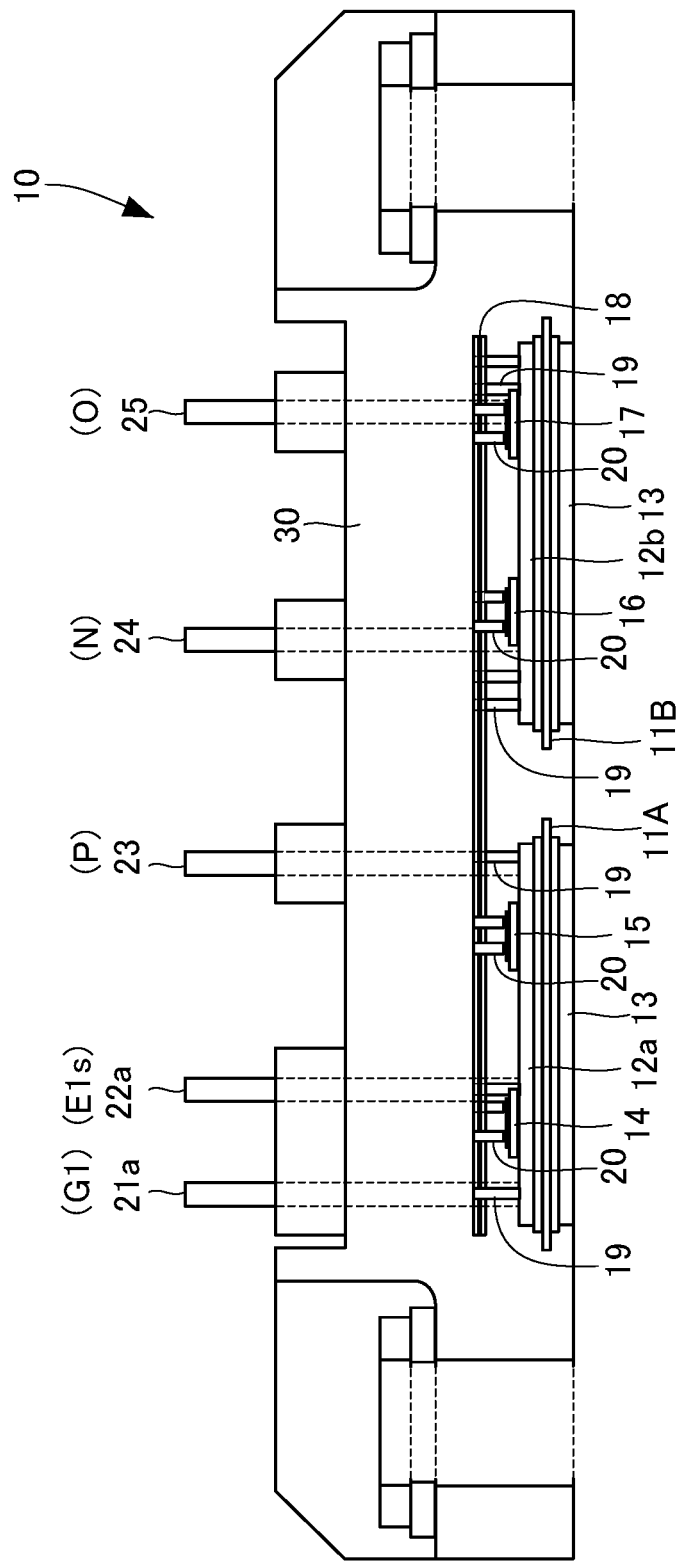
FIG. 3 is a cross-sectional view of the semiconductor module.

(a) First Embodiment ext described is an exemplary semiconductor module used in a first embodiment, with reference to FIGS. 1 to 3. FIGS. 1 and 2 are perspective views of the exterior of the semiconductor module, and FIG. 3 is a cross-sectional view of the semiconductor module. Note that the cross-sectional view of FIG. 3 is taken along the longitudinal centerline of the semiconductor module 10 of FIGS. 1 and 2.

The semiconductor module 10 includes first to fourth semiconductor chips 14 to 17; a sealing unit 30 for sealing the first to fourth semiconductor chips 14 to 17 therein; conductive posts 19 and 20 for electrically connecting to the first to fourth semiconductor chips 14 to 17 inside the sealing unit 30; and external connecting terminals 21a, 21b, 22a, 22b, 23, 24, and 25. Specifically, the semiconductor module 10 internally includes the first to fourth semiconductor chips 14 to 17, a first circuit board 12a, a second circuit board 12b, and third circuit boards (not illustrated), as depicted in FIG. 3. Further, the semiconductor module 10 includes a printed board 18, the conductive posts 19 and 20, and the external connecting terminals 21a, 21b, 22a, 22b, 23, 24, and 25. The semiconductor module 10 is sealed with the sealing unit 30 in the form of an approximately rectangular parallelepiped. On the front surface of the sealing unit 30, the external connecting terminals 21a, 22a, 23, 24, and 25 are arranged axisymmetrically to the external connecting terminals 21b, 22b, 23, 24, and 25 along the longitudinal centerline of the front surface.

As for each of the external connecting terminals 21a, 21b, 22a, 22b, 23, 24, and 25, a first end extends from the front surface of the sealing unit 30 of the semiconductor module 10 into the inside of the sealing unit 30 while the other second end extends from the front surface of the sealing unit 30 and projects perpendicular to the front surface. Further, the second ends are arranged in two rows along the longitudinal direction. The external connecting terminals 21a, 21b, 22a, and 22b are control terminals for controlling switching of the semiconductor module 10. The external connecting terminals 21a and 21b are gate terminals (G1 and G2 terminals) electrically connected to gate electrodes of the first and third semiconductor chips 14 and 16 (to be described later). The external connecting terminals 22a and 22b are Kelvin emitter terminals (E1s and E2s terminals) electrically connected to emitter electrodes of the first and third semiconductor chips 14 and 16 (to be described later). The external connecting terminals 23, 24, and 25 are main terminals where the principal current flows in and out. The external connecting terminals 23 are input terminals (P terminals) which are electrically connected to a collector electrode of the first semiconductor chip (to be described later) and through which positive input current flows. The external connecting terminals 24 are input terminals (N terminals) which are electrically connected to the emitter electrode of the third semiconductor chip 16 and through which negative input current flows. The external connecting terminals 25 are output terminals (O terminals) which are electrically connected to the emitter electrode of the first semiconductor chip 14 and a collector electrode of the third semiconductor chip 16 (to be described later) and through which output current flows. The external connecting terminals 23, 24, and 25 are individually arranged in pairs side by side along the lateral direction of the semiconductor module 10. Note that the external connecting terminals 21a, 21b, 22a, 22b, 23, 24, and 25 are cylindrical or prismatic in shape. The external connecting terminals 21a, 21b, 22a, 22b, 23, 24, and 25 preferably have the same shape as terminal holes 41 formed on conducting boards 40 (to be described later) in terms of obtaining reliable electric connection. Further, in terms of facilitating assembly workability, both the external connecting terminals 21a, 21b, 22a, 22b, 23, 24, and 25 and the terminal holes 41 on the conducting boards are cylindrical in shape. The external connecting terminals 21a, 21b, 22a, 22b, 23, 24, and 25 are made of a material with excellent electrical conductivity. The material is, for example, silver, copper, nickel, or an alloy containing at least one of these.

The semiconductor module 10 includes a first insulating substrate 11A and a second insulating substrate 11B positioned side-by-side in a horizontal direction. The first insulating substrate 11A and the second insulating substrate 11B are made of ceramics with good thermal conductivity, such as aluminum oxide, aluminum nitride, or silicon nitride. As for the first insulating substrate 11A, the first circuit board 12a is placed on its upper surface, and a metal plate 13 having the same thickness as the first circuit board 12a is placed on its rear surface. As for the second insulating substrate 11B, the second circuit board 12b is placed on its upper surface, and the metal plate 13 having the same thickness as the second circuit board 12b is placed on its rear surface. Further, a plurality of third circuit boards is placed on the upper surfaces of the first insulating substrate 11A and the second insulating substrate 11B. The first circuit board 12a, the second circuit board 12b, and the third circuit boards individually have a thickness, for example, in the range of 0.5 mm to 1.5 mm inclusive. The first circuit board 12a and the second circuit board 12b are made of a material with excellent electrical conductivity. The material is, for example, silver, copper, nickel, or an alloy containing at least one of these. In order to provide improved corrosion resistance, for example, nickel plating or the like is applied to coat the surfaces of the first circuit board 12a and the second circuit board 12b. Other than nickel, a nickel-phosphorus alloy or nickel-boron alloy may be used for the plating. The metal plates 13 are made of metal having excellent thermal conductivity, such as aluminum, iron, silver, copper, or an alloy containing at least one of these. The metal plates 13 are exposed from the rear surface of the sealing unit 30, as illustrated in FIG. 2. As the first insulating substrate 11A and the second insulating substrate 11B described above, direct copper bonding (DCB) or active metal brazed (AMB) substrates, for example, may be used.

To improve heat dissipation, a cooler (not illustrated) may be attached to the rear surface of the semiconductor module 10, from which the metal plates 13 are exposed. In this case, the cooler is made of a material with excellent thermal conductivity. The material is, for example, aluminum, iron, silver, copper, or an alloy containing at least one of these. As the cooler, a fin, a heatsink with a plurality of fins, or a water cooling system may be used, for example. In addition, a base board may be integrally formed with such a cooler. In that case, the base board is made of a material with excellent thermal conductivity, such as aluminum, iron, silver, copper, or an alloy containing at least one of these. Then, in order to provide improved corrosion resistance, for example, nickel plating or the like is applied to coat the surface of a heat dissipation plate integrally formed with the cooler. Other than nickel, a nickel-phosphorus alloy or nickel-boron alloy may be used for the plating.

On the first circuit board 12a, the first semiconductor chip 14 and the second semiconductor chip 15 are mounted via solder (not illustrated). Similarly, on the second circuit board 12b, the third semiconductor chip 16 and the fourth semiconductor chip 17 are mounted via solder (not illustrated). That is, the first to fourth semiconductor chips 14 to 17 are arranged separately on the first insulating substrate 11A and the second insulating substrate 11B. If the first insulating substrate 11A and the second insulating substrate 11B are integrally formed, the insulating substrate thus formed is likely to undergo large deformation due to thermal stress, which may cause the insulating substrate or resin to be broken or separate circuit boards and resin to be debonded from the insulating substrate. In view of this problem, the first embodiment provides two separate insulating substrates, thereby improving reliability thereof.

The first semiconductor chip 14 and the third semiconductor chip 16 are switching elements, and semiconductor chips such as IGBTs or power MOSFETs, made of silicone or silicon carbide, may be employed here. In this case, the first semiconductor chip 14 and the third semiconductor chip 16 individually include, for example, a collector electrode (or drain electrode) on their rear surfaces as a main electrode and a gate electrode and an emitter electrode (or source electrode) on their front surfaces as main electrodes. The second semiconductor chip 15 and the fourth semiconductor chip 17 are diode elements used as freewheeling diodes (FWDs), for example, Schottky barrier diodes (SBDs) and P-intrinsic-N (PiN) diodes. In this case, the second semiconductor chip 15 and the fourth semiconductor chip 17 individually include a cathode electrode on their rear surfaces as a main electrode and an anode electrode on their front surfaces as a main electrode. When made of silicon carbide, the first to fourth semiconductor chips 14 to 17 individually have a thickness in the range of, for example, 180 μm to 220 μm inclusive, with an average of about 200 μm. When made of silicon, the first to fourth semiconductor chips 14 to 17 individually have a thickness in the range of, for example, 60 μm to 200 μm inclusive, with an average of about 120 μm.

Above the first circuit board 12a and the second circuit board 12b, the printed board 18 is disposed, opposing the first circuit board 12a and the second circuit board 12b at a predetermined distance. The printed board 18 includes metal layers (not illustrated) with a wiring pattern, each on the upper and lower surfaces thereof.

Electrical connection between a predefined metal layer of the printed board 18 and the first and second circuit boards 12a and 12b or the third circuit boards is provided by the conductive posts 19. In addition, electrical connection between a predefined metal layer of the printed board 18 and the first to fourth semiconductor chips 14 to 17 is provided by the conductive posts 20. Further, the external connecting terminals 21a, 21b, 22a, 22b, 23, 24, and 25 are electrically and mechanically connected to the first circuit board 12a, the second circuit board 12b, and the third circuit boards. Joining materials having electrical conductivity, such as solder and sintered metal, may be used to form the connection between the above-cited members.

The first circuit board 12a, the second circuit board 12b, the third circuit boards, the first to fourth semiconductor chips 14 to 17, the conductive posts 19 and 20, and the printed board 18 are sealed in the sealing unit 30. The sealing unit 30 includes a thermosetting resin, such as epoxy resin, phenolic resin, or maleimide resin, and a filler material contained in the thermosetting resin. Specifically, the sealing unit 30 is made of, for example, epoxy resin including a filler material, such as silicon dioxide, aluminum oxide, boron nitride, or aluminum nitride. Then, the semiconductor module 10 illustrated in FIGS. 1 and 2 is formed.

Electrical connections in the semiconductor module 10 are made as follows. The collector electrode of the first semiconductor chip 14 is connected, via the first circuit board 12a, to the external connecting terminals 23 (P terminals). The emitter electrode of the first semiconductor chip 14 is first connected, via a conductive post 20, to the corresponding metal layer of the printed board 18 and then connected, via a conductive post 19 and the second circuit board 12b, to the external connecting terminals 25 (O terminals). The gate electrode of the first semiconductor chip 14 is first connected, via a conductive post 20, to the corresponding metal layer of the printed board 18 and then connected, via a conductive post 19 and a third circuit board, to the external connecting terminal 21a (G1 terminal). An auxiliary emitter electrode of the first semiconductor chip 14 is first connected, via a conductive post 20, to the corresponding metal layer of the printed board 18 and then connected, via a conductive post 19 and a third circuit board, to the external connecting terminal 22a (E1s terminal).

The cathode electrode of the second semiconductor chip 15 is connected, via the first circuit board 12a, to the external connecting terminals 23 (P terminals). The anode electrode of the second semiconductor chip 15 is first connected, via a conductive post 20, to the corresponding metal layer of the printed board 18 and then connected, via a conductive post 19 and the second circuit board 12b, to the external connecting terminals 25 (O terminals).

The collector electrode of the third semiconductor chip 16 is connected, via the second circuit board 12b, to the external connecting terminals 25 (O terminals). The emitter electrode of the third semiconductor chip 16 is first connected, via a conductive post 20, to the corresponding metal layer of the printed board 18 and then connected, via a conductive post 19 and a third circuit board, to the external connecting terminals 24 (N terminals). The gate electrode of the third semiconductor chip 16 is first connected, via a conductive post 20, to the corresponding metal layer of the printed board 18 and then connected, via a conductive post 19 and a third circuit board, to the external connecting terminal 21b (G2 terminal). An auxiliary emitter electrode of the third semiconductor chip 16 is first connected, via a conductive post 20, to the corresponding metal layer of the printed board 18 and then connected, via a conductive post 19 and a third circuit board, to the external connecting terminal 22b (E2s terminal).

The cathode electrode of the fourth semiconductor chip 17 is connected, via the second circuit board 12b, to the external connecting terminals 25 (O terminals). The anode electrode of the fourth semiconductor chip 17 is first connected, via a conductive post 20, to the corresponding metal layer of the printed board 18 and then connected, via a conductive post 19 and a third circuit board, to the external connecting terminals 24 (N terminals).

Figure 4A:
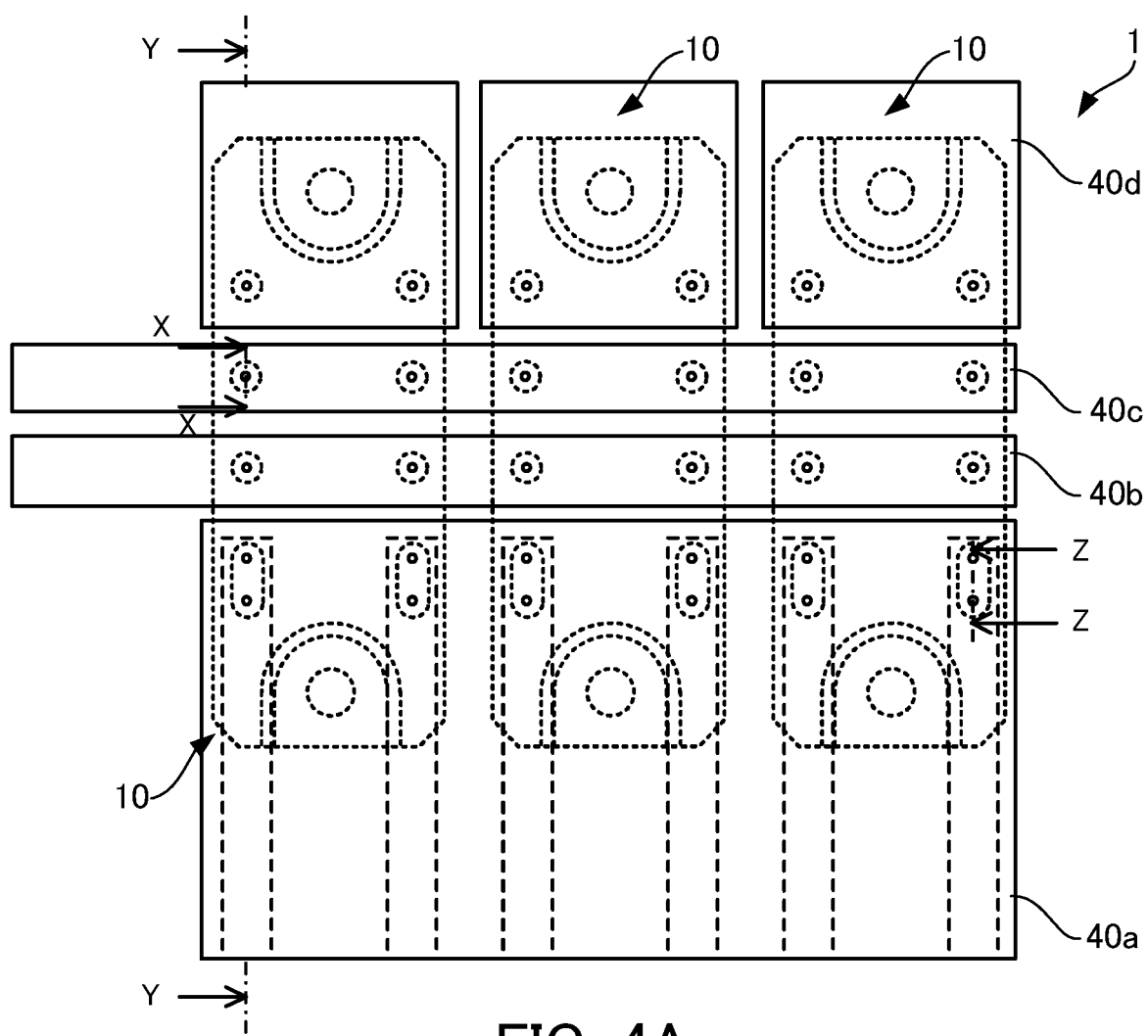
FIGS. 4A and 4B illustrate an exemplary semiconductor device according to a first embodiment.
Figure 4B:
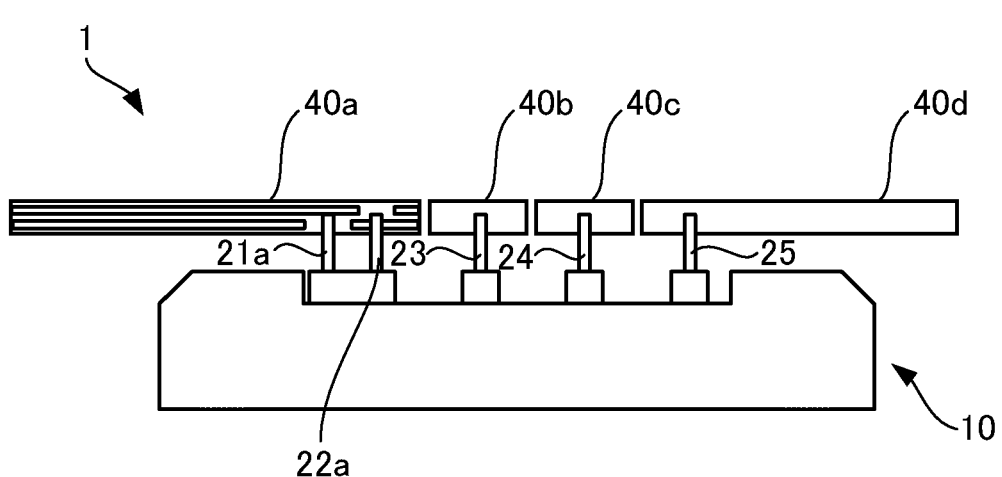

Next described is a semiconductor device having a plurality of semiconductor modules 10, each including the above-described external connecting terminals 21a, 21b, 22a, 22b, 23, 24, and 25, with reference to FIGS. 4A and 4B. FIGS. 4A and 4B illustrate an exemplary semiconductor device according to the first embodiment. FIG. 4A is a plan view of a semiconductor device 1, and FIG. 4B is a cross-sectional view of the semiconductor device 1 along dashed-dotted line Y-Y of FIG. 4A. Note that joining between the external connecting terminals 21a, 22a, 23, 24, and 25 and conducting boards 40a to 40d is illustrated simplistically. The semiconductor device 1 includes three semiconductor modules 10 and the conducting boards 40a to 40d that make up a three-phase bridge inverter circuit. Note that the term "conducting boards 40" may be used in the following description when no distinction is made among the conducting boards 40a to 40d.

The conducting boards 40 are boards including electric conductors and, for example, busbars and printed-circuit boards. The conducting boards 40 electrically connect external devices, such as a driver circuit, power supply, and output equipment, and the external connecting terminals 21a, 21b, 22a, 22b, 23, 24, and 25 of the semiconductor modules 10, to thereby enable control over the semiconductor modules 10 and voltage input and output, or the like, for the semiconductor modules 10. The conducting boards 40 are electrically connected to the external connecting terminals 21a, 21b, 22a, 22b, 23, 24, and 25 of each semiconductor module 10, arranged in two rows. Specifically, the conducting board 40a is a printed-circuit board. To the conducting board 40a, the external connecting terminals 21a, 21b, 22a, and 22b, which are control terminals, are electrically connected. The conducting board 40b is a busbar. To the conducting board 40b, the external connecting terminals 23, which are main terminals, are electrically connected. The conducting board 40c is also a busbar. To the conducting board 40c, the external connecting terminals 24, which are main terminals, are electrically connected. The conducting boards 40d are also busbars. To the conducting boards 40d, the external connecting terminals 25, which are main terminals, are electrically connected. In this state, the second ends of the individual external connecting terminals 21a, 21b, 22a, 22b, 23, 24, and 25 are electrically connected to the conducting boards 40 without penetrating through them. Note that the semiconductor device 1 is not limited to including three semiconductor modules 10, and may include at least one semiconductor module 10 and a plurality of conducting boards 40. For example, a plurality of semiconductor modules 10 may be aligned in the lateral direction in such a manner that the long sides of the semiconductor modules 10 oppose each other.

Next described is joining of the external connecting terminals 21a, 21b, 22a, 22b, 23, 24, and 25 to the above-described conducting boards 40, with reference to FIGS. 5 to 11. FIGS. 5 to 11 illustrate joining of the external connecting terminals to the conducting boards according to the first embodiment. Note that FIGS. 5 to 11 are cross-sectional views along dashed-dotted line X-X of FIG. 4A. Each of FIGS. 5A, 5B, 6A, 6B, 7A, 7B, 8 to 10, 11A, and 11B illustrates exemplary joining of an external connecting terminal to a conducting board 40. Although the following describes the case of the external connecting terminal 24 amongst the external connecting terminals 21a, 21b, 22a, 22b, 23, 24, and 25 as an example, the remaining external connecting terminals are also joined to corresponding conducting boards 40 in the same manner. Note that the first embodiment assumes that the conducting board 40 is a busbar. A lock part having a stepped portion, a taper, or a projection is formed on at least one of a terminal hole on the conducting board 40 and the second end of the external connecting terminal 24. The lock part locks in the second end of the external connecting terminal 24 inserted into the terminal hole. In this manner, the second end of the external connecting terminal remains inside the terminal hole without penetrating through the conducting board 40. Detailed and specific description is provided below.

Figure 5A:
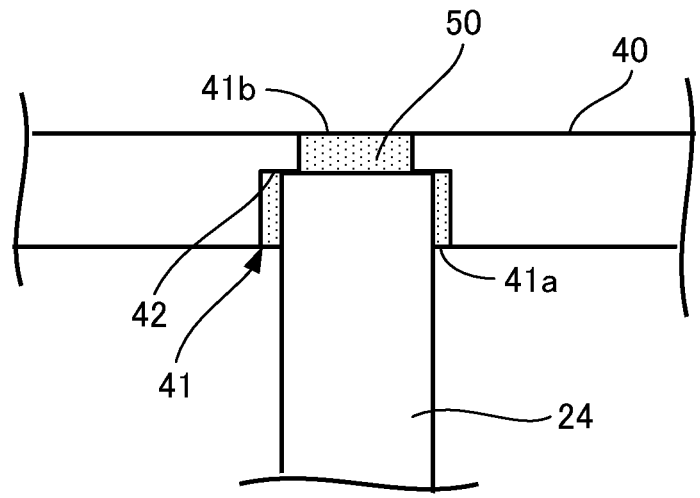
FIGS. 5A and 5B are a first part of drawings illustrating joining of an external connecting terminal to a conducting board according to the first embodiment.

In the first example illustrated in FIG. 5A, a terminal hole 41 is formed on the conducting board 40. The terminal hole 41 is formed such that it penetrates through the conducting board 40 from an inlet 41a on the rear surface to an outlet 41b on the opposite front surface. Note that the terminal hole 41 is circular, polygonal, or the like in plan view according to the shape of the external connecting terminal 24. In addition, a stepped portion 42 is formed between the inlet 41a and the outlet 41b, all around the inner periphery of the terminal hole 41. Therefore, in this case, the inlet 41a has a larger opening area than the outlet 41b. Note that the stepped portion 42 may be formed partially along the inner periphery of the terminal hole 41. To this terminal hole 41, the second end of the external connecting terminal 24 is joined. The second end of the external connecting terminal 24 is cylindrical in shape with no projection or stepped portion formed around its side periphery. In this case, a peripheral edge of the tip face of the second end of the external connecting terminal 24 abuts against the stepped portion 42 of the terminal hole 41, and the second end of the external connecting terminal 24 is fixed by solder 50 sealing the clearance between the external connecting terminal 24 and the terminal hole 41. In this manner, the second end of the external connecting terminal 24 remains inside the terminal hole 41. Accordingly, the external connecting terminal 24 is electrically connected to the conducting board 40 without penetrating through it.

Figure 5B:
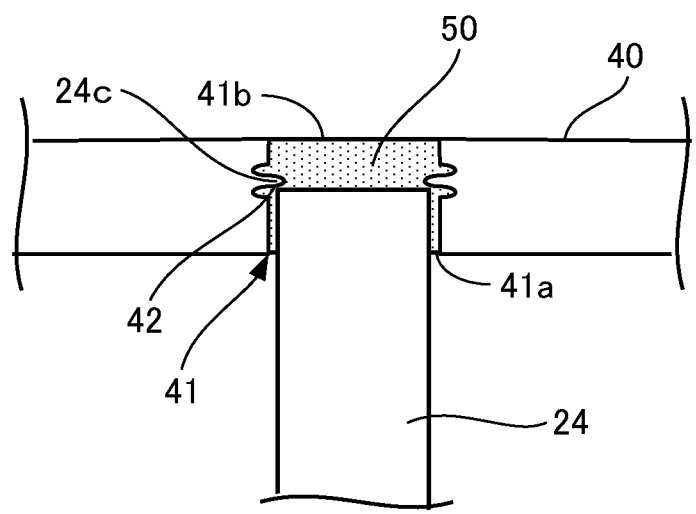

In another example illustrated in FIG. 5B, the terminal hole 41 is formed on the conducting board 40 such that it penetrates through the conducting board 40 from the inlet 41a on the rear surface to the outlet 41b on the opposite front surface. Note that the terminal hole 41 is circular, polygonal, or the like in plan view according to the shape of the external connecting terminal 24. In addition, a projection 24c projecting inwardly inside the terminal hole 41 is formed as a lock part at a predetermined position on the inner periphery of the terminal hole 41, away from the inlet 41a. The projection 24c is located between two depressions. The stepped portion 42 formed on the inner periphery of the terminal hole 41 by the projection 24c extends along the entire inner periphery of the terminal hole 41. Alternatively, the stepped portion 42 may be formed at least partially along the inner periphery. To this terminal hole 41, the second end of the external connecting terminal 24 is joined. The second end of the external connecting terminal is columnar in shape with no projection or stepped portion formed around its side periphery. In this case, a peripheral edge of the tip face of the second end of the external connecting terminal 24 abuts against the projection 24c, and the second end of the external connecting terminal 24 is then fixed by the solder 50 sealing the clearance between the external connecting terminal 24 and the terminal hole 41. In this manner, the second end of the external connecting terminal 24 remains inside the terminal hole 41. Accordingly, the external connecting terminal 24 is electrically connected to the conducting board 40 without penetrating through it.

Figure 6A:
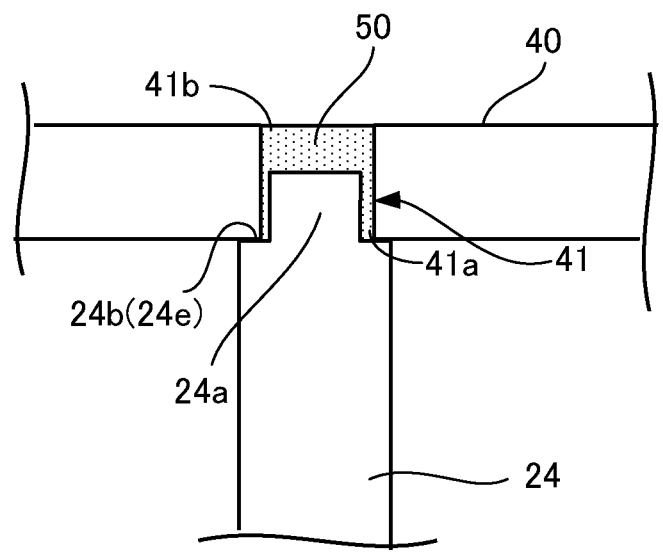
FIGS. 6A and 6B are a second part of the drawings illustrating joining of the external connecting terminal to the conducting board according to the first embodiment.

In yet another example illustrated in FIG. 6A, the terminal hole 41 is formed on the conducting board 40 such that it penetrates through the conducting board 40 from the inlet 41a on the rear surface to the outlet 41b on the opposite front surface. In this case, the terminal hole 41 is hollow and has a columnar shape with no projection or stepped portion formed around its inner periphery. The inlet 41a and the outlet 41b of the terminal hole 41 oppose each other, and have the same shape and opening area. On the other hand, a projection 24a is formed on the tip face of the external connecting terminal 24, and a stepped portion 24e is formed on a peripheral edge 24b encompassing the projection 24a. The projection 24a of the external connecting terminal 24 fits into the terminal hole 41 via the solder 50 while the stepped portion 24e formed on the peripheral edge 24b of the external connecting terminal 24 abuts against the rim of the inlet 41a of the terminal hole 41 formed on the conducting board 40. Thus, the external connecting terminal 24 is joined to the terminal hole 41 on the conducting board 40. In this manner, the second end of the external connecting terminal 24 remains inside the terminal hole 41. Accordingly, the external connecting terminal 24 is electrically connected to the conducting board 40 without penetrating through it. In addition, the projection 24a formed on the tip face of the external connecting terminal 24 provides an additional surface adhesion area between the external connecting terminal 24 and the solder 50. As a result, the external connecting terminal 24 is joined to the terminal hole 41 with higher strength compared with the example of FIG. 5A.

Figure 6B:
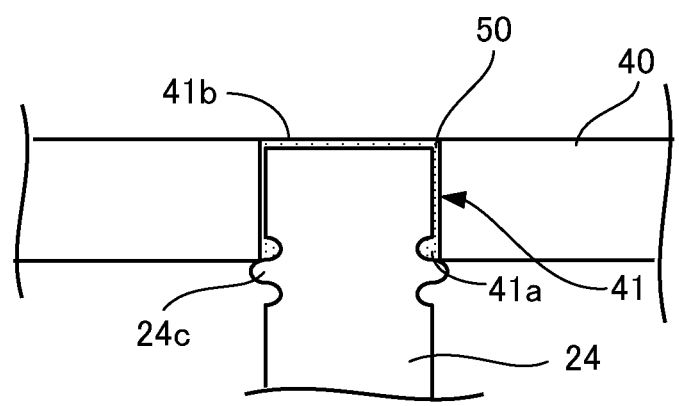

In another example illustrated in FIG. 6B, the terminal hole 41 on the conducting board 40 is columnar in shape with no projection or stepped portion formed on its inner periphery. On the external connection terminal 24, on the other hand, the projection 24c is formed along the side periphery of the external connection terminal 24, at a predefined distance away from the tip face of the second end. The projection 24c may be formed all around the side periphery of the external connecting terminal 24, or alternatively at least partially along the side periphery of the external connecting terminal 24. To form the projection 24c of the external connecting terminal 24, a pressing tool is pressed against the external connection terminal 24, at the upper and lower edges (in the longitudinal direction of the external connecting terminal 24) of a region where the projection 24c is to be formed, to thereby form depressions. An intermediate part between the depressions bulges out to make a convex configuration, thereby forming the projection 24c. The projection 24c may be formed in advance on the side periphery of the external connecting terminal 24 in the manner described above, or may be separately prepared instead. In this case, when the external connecting terminal 24 is inserted into the terminal hole 41 on the conducting board 40 from the inlet 41a, the projection 24c abuts against the rim of the inlet 41a of the terminal hole 41. Then, the external connecting terminal 24 is fixed by the solder 50 sealing the clearance between the external connecting terminal 24 and the terminal hole 41. The tip face of the second end is located between the inlet 41a and the outlet 41b of the terminal hole 41. Thus, the external connecting terminal 24 is electrically connected to the conducting board 40 without penetrating through it.

Figure 7A:
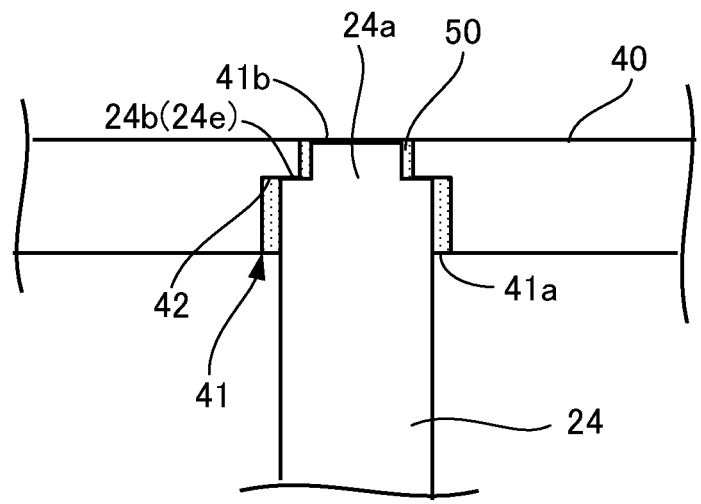
FIGS. 7A and 7B are a third part of the drawings illustrating joining of the external connecting terminal to the conducting board according to the first embodiment.

In another example illustrated in FIG. 7A, the projection 24a is integrally formed with the external connecting terminal 24 of FIG. 5A such that the projection 24a is situated on the inner side of the peripheral edge 24b of the tip face of the external connecting terminal 24. The projection 24a here has a size and shape suitable for being housed in the space within the terminal hole 41 between the stepped portion 42 and the outlet 41b. The external connecting terminal 24 is positioned in the terminal hole 41 such that the projection 24a is housed in the space within the terminal hole 41 between the stepped portion 42 and the outlet 41b. Then, the stepped portion 24e formed on the peripheral edge 24b of the external connecting terminal 24 abuts against the stepped portion 42 of the terminal hole 41, and the external connecting terminal 24 is then fixed by the solder 50 sealing the clearance between the external connecting terminal 24 and the terminal hole 41. In this manner, the second end of the external connecting terminal 24 remains inside the terminal hole 41. Accordingly, the external connecting terminal 24 is electrically connected to the conducting board 40 without penetrating through it. In addition, the projection 24a formed on the tip face of the external connecting terminal 24 provides an additional surface adhesion area between the second end of the external connecting terminal 24 and the solder 50. As a result, the external connecting terminal 24 is joined to the terminal hole 41 with higher strength compared with the example of FIG. 5A.

Figure 7B:
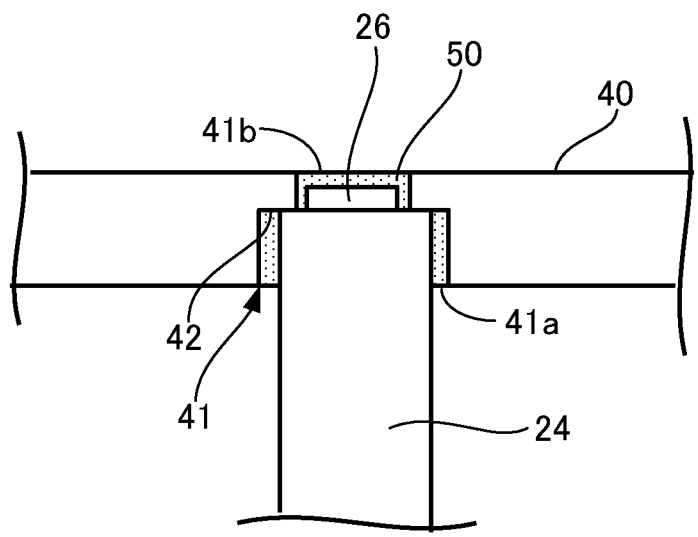

In another example illustrated in FIG. 7B, a spacer 26 is placed on the tip face of the external connecting terminal 24 of FIG. 5A. The spacer 26 is made of the same material as the external connecting terminal 24. In addition, the spacer 26 has a size and shape suitable for being housed in the space within the terminal hole 41 between the stepped portion 42 and the outlet 41b, and has the same shape as the external connecting terminal 24, i.e., a shape of a cylinder or a prism. Herewith, the external connecting terminal 24 and the spacer 26 are electrically connected to the conducting board 40 without penetrating through it. By placing the spacer 26 described above on the tip face of the external connecting terminal 24, the second end of the external connecting terminal 24 is fixed together with the spacer 26 by the solder 50. As a result, the external connecting terminal 24 is joined to the terminal hole 41 with higher strength compared with the example of FIG. 5A.

Figure 8:
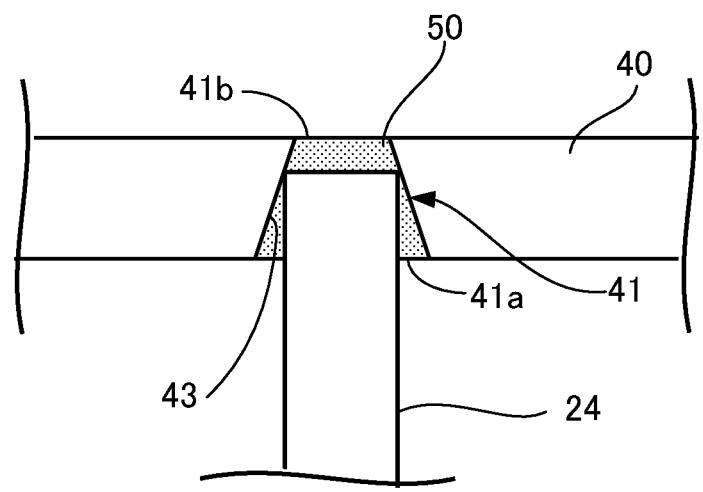
FIG. 8 is a fourth part of the drawings illustrating joining of the external connecting terminal to the conducting board according to the first embodiment.

In another example illustrated in FIG. 8, the conducting board 40 has a tapered part 43 formed on the inner periphery of the terminal hole 41. In this case, when the second end of the external connecting terminal 24 fits into the terminal hole 41, the outer edge of the tip face of the second end abuts against the tapered part 43. In this manner, the external connection terminal 24 is fixed with the terminal hole 41 by the solder 50, and thus the second end of the external connecting terminal 24 remains inside the terminal hole 41. Herewith, the external connecting terminal 24 is electrically connected to the conducting board 40 without penetrating through it.

Figure 9:
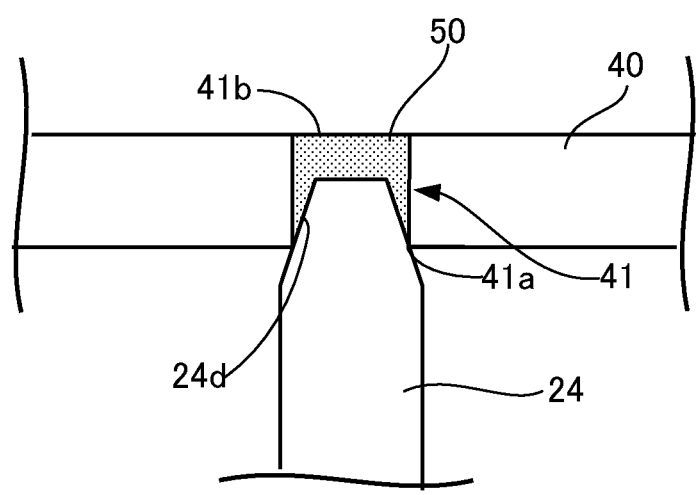
FIG. 9 is a fifth part of the drawings illustrating joining of the external connecting terminal to the conducting board according to the first embodiment.

In another example illustrated in FIG. 9, the terminal hole 41 is formed on the conducting board 40 such that it penetrates through the conducting board 40 from the inlet 41*a* on the rear surface to the outlet 41*b* on the opposite front surface. On the other hand, the external connecting terminal 24 has a tapered part 24*d* formed on its second end. In this case, when the external connecting terminal 24 is inserted into the terminal hole 41 on the conducting board 40 from the inlet 41*a*, the tapered part 24*d* abuts against the rim of the inlet 41*a* of the terminal hole 41. In this state, the external connecting terminal 24 is fixed by the solder 50 sealing the clearance between the external connecting terminal 24 and the terminal hole 41, and thus the second end of the external connecting terminal 24 remains inside the terminal hole 41. Herewith, the external connecting terminal 24 is electrically connected to the conducting board 40 without penetrating through it.

Figure 10:
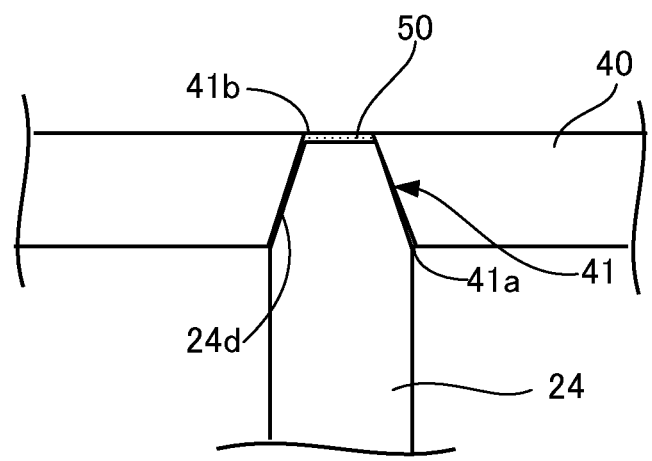
FIG. 10 is a sixth part of the drawings illustrating joining of the external connecting terminal to the conducting board according to the first embodiment.

In another example illustrated in FIG. 10, the external connecting terminal 24 has the tapered part 24*d* formed on its second end. On the other hand, the conducting board 40 has an inclined surface on the inner periphery of the terminal hole 41, corresponding to the tapered part 24*d*. In this case, when the external connecting terminal 24 is inserted into the terminal hole 41 of the conducting board 40 from the inlet 41*a*, the tapered part 24*d* abuts against the inclined surface of the terminal hole 41. In this state, the external connecting terminal 24 is fixed by the solder 50 sealing the clearance between the external connecting terminal 24 and the terminal hole 41, and thus the second end of the external connecting terminal 24 remains inside the terminal hole 41. Herewith, the external connecting terminal 24 is electrically connected to the conducting board 40 without penetrating through it. The formation of the tapered part 24*d* on the external connecting terminal 24 and the inclined surface in the terminal hole 41 allows the external connecting terminal 24 to be joined to the terminal hole 41 with higher strength compared with the examples of FIGS. 8 and 9.

Figure 11A:
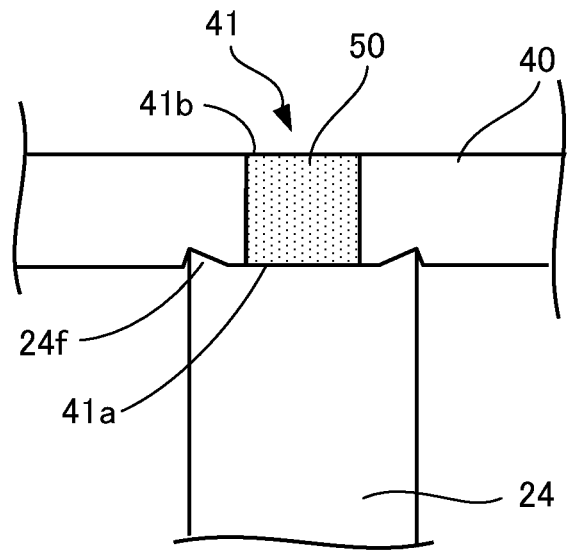
FIGS. 11A and 11B are a seventh part of the drawings illustrating joining of the external connecting terminal to the conducting board according to the first embodiment.

In another example illustrated in FIG. 11A, the external connecting terminal 24 is columnar in shape with no projection or stepped portion formed on the side periphery. The area of the tip face of the external connecting terminal 24 is larger than the opening area of the inlet 41*a*, as seen in FIG. 11A. In addition, the external connecting terminal 24 has a projection 24*f* formed on the peripheral edge of the tip face of the second end. Note that the projection 24*f* may be formed all around the peripheral edge of the tip face or, alternatively, partially along the peripheral edge. On the other hand, the terminal hole 41 is formed on the conducting board 40 such that it penetrates through the conducting board 40 from the inlet 41*a* on the rear surface to the outlet 41*b* on the opposite front surface. In this case, the terminal hole 41 is hollow and has a columnar shape with no projection or stepped portion formed around its inner periphery. The inlet 41*a* and the outlet 41*b* of the terminal hole 41 oppose each other, and have the same shape and opening area. Further, the conducting board 40 has a depression around the rim of the inlet 41*a*. Note that the depression may be formed to oppose the projection 24*f* of the external connecting terminal 24. The depression may be formed to correspond to the entire edge of the projection 24*f* or, alternatively, only part of the edge. The second end of the external connecting terminal 24 blocks the inlet 41*a* because the area of its tip face is larger than the opening area of the inlet 41*a* of the terminal hole 41 on the conducting board 40, and the peripheral edge of the tip face abuts against the rim of the inlet 41*a*. Further, the tip face of the second end is fixed by the solder 50 filling the terminal hole 41. Herewith, the external connecting terminal 24 is electrically connected to the conducting board 40 without penetrating through it. Then, the projection 24*f* fits into the depression around the rim of the inlet 41*a*, and thereby the second end engages with the terminal hole 41. Therefore, the external connecting terminal 24 is joined to the conducting board 40 in place with no shift in position. Note that the projection 24*f* may be formed at the rim of the inlet 41*a* of the terminal hole 41 on the conducting board 40 instead. In this case, the external connecting terminal 24 has a depression formed at the peripheral edge of the tip face of the second end.

Figure 11B:
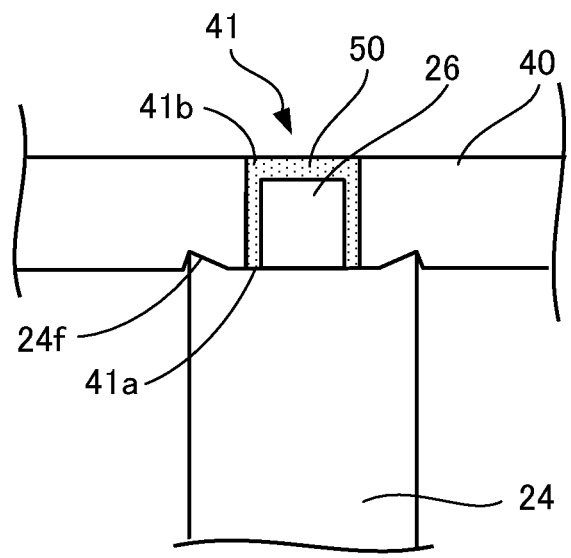

In another example illustrated in FIG. 11B, the spacer 26 is placed on the tip face of the external connecting terminal 24 of FIG. 11A, as in the case of FIG. 7B. The spacer 26 is made of the same material as the external connecting terminal 24. In addition, the spacer 26 has a size and shape suitable for being housed in the space within the terminal hole 41 between the inlet 41*a* and the outlet 41*b*, and has the same shape as the external connecting terminal 24, i.e., a shape of a cylinder or a prism. Herewith, the external connecting terminal 24 and the spacer 26 are electrically connected to the conducting board 40 without penetrating through it. By placing the spacer 26 described above on the tip face of the external connecting terminal 24, the second end of the external connecting terminal 24 is fixed together with the spacer 26 by the solder 50. As a result, the external connecting terminal 24 is joined to the terminal hole 41 with higher strength compared with the example of FIG. 11A.

As described above, the semiconductor device 1 includes semiconductor modules, each including the first to fourth semiconductor chips 14 to 17; and the external connecting terminals 24, the first ends of which are electrically connected to the first to fourth semiconductor chips 14 to 17 and the second ends of which extend from the first to fourth semiconductor chips 14 to 17. The semiconductor device 1 also includes the conducting boards 40 with the terminal holes 41 formed on the major surfaces of the conducting boards 40 and penetrating therethrough. The second ends of the external connecting terminals 24 inserted into the terminal holes 41 from the inlets 41*a* toward the outlets 41*b* fit into the terminal holes 41 and are then fixed by the solder 50. Herewith, the external connecting terminals 24 and the conducting boards 40 are electrically connected to each other. Further, at least either of the terminal holes 41 on the conducting boards 40 or the second ends of the external connecting terminals 24 individually have a lock part, in the form of a stepped portion, a taper, or a projection. The lock parts lock in the second ends of the external connecting terminals 24 inserted into the terminal holes 41, and thereby the second ends remain inside the terminal holes 41. As a result, the second ends of the external connecting terminals 24 are joined to the conducting boards 40 without protruding therefrom. This eases limitations on space above the conducting boards 40, which in turn allows a reduction in the height of the semiconductor device 1, thus resulting in downsizing of the semiconductor device 1.

Next described are methods of joining the external connecting terminals 24 to the terminal holes 41 on the conducting boards 40, with reference to FIGS. 12 to 14. FIGS. 12 to 14 illustrate methods of joining the external connecting terminals to the conducting boards according to the first embodiment. Note that the following describes joining methods applied to the case of FIG. 5A amongst FIGS. 5 to 11; however, the joining methods below are applicable to the cases other than that illustrated in FIG. 5A.

First, the semiconductor modules 10 and the conducting boards 40 are prepared. On the rear surface (major surface)

of each conducting board 40, opposing the semiconductor modules 10, the terminal holes 41 are formed, which penetrate through the conducting board 40 from the inlets 41a on the rear surface to the outlets 41b on the opposite front surface. In addition, each terminal hole 41 has the stepped portion 42 between the inlet 41a and the outlet 41b.

Figure 12A:
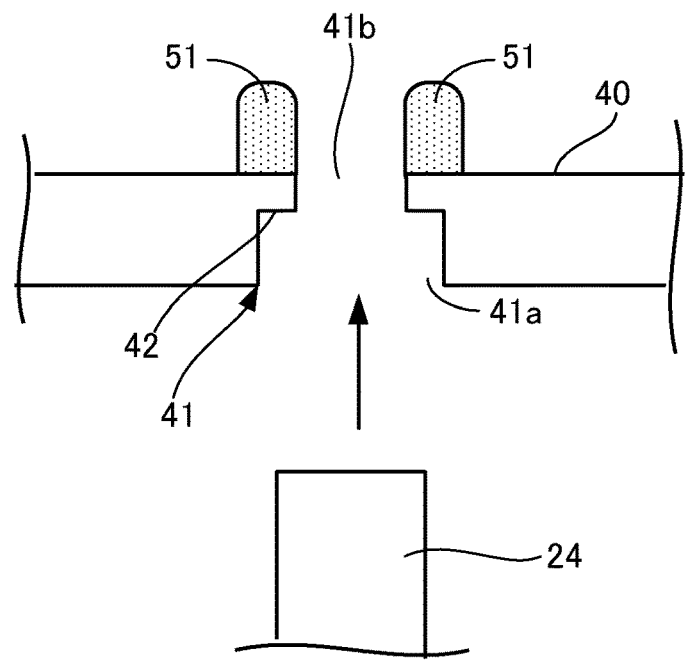
FIGS. 12A and 12B illustrate a first part of methods of joining the external connecting terminal to the conducting board according to the first embodiment.

Now let us refer to FIG. 12A where the conducting board 40 is set such that the terminal hole 41 opposes the external connecting terminal 24, and the solder 51 is disposed around the outlet 41b of the terminal hole 41 on the conducting board 40. Note that, in this case, the solder 51 may be disposed on the conducting board 40 first, which is then followed by setting the conducting board 40 to oppose the external connecting terminal 24. Subsequently, the second end of the external connecting terminal 24 is inserted into the terminal hole 41 on the conducting board 40 from the inlet 41a until it abuts against the stepped portion 42 in the terminal hole 41. At this time, the external connecting terminal 24 fits into the terminal hole 41 on the conducting board 40 without penetrating through it.

Figure 12B:
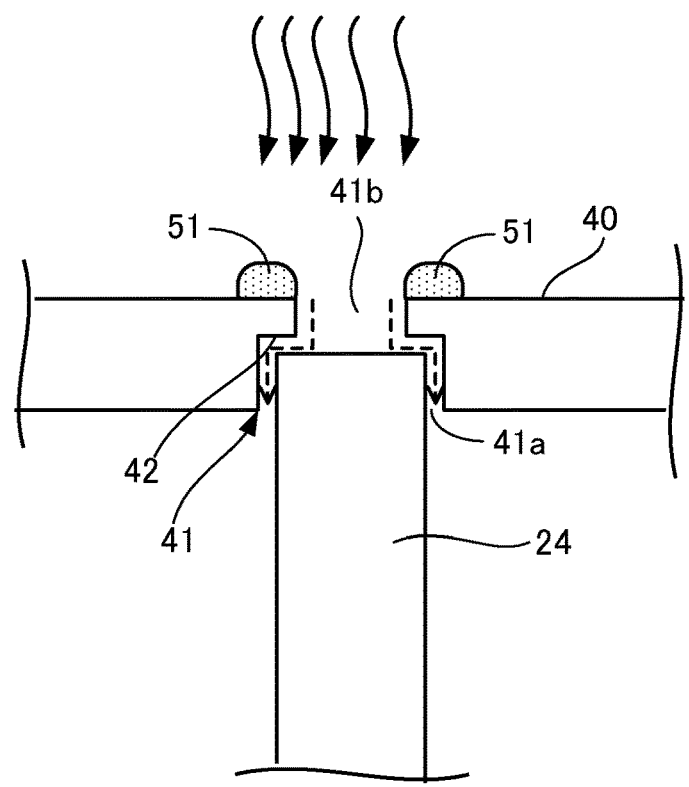

In this condition, the solder 51 is melted by heat, for example, using a soldering iron. As illustrated in FIG. 12B, the melted solder 51 flows from the outlet 41b of the conducting board 40 into the terminal hole 41, into which the external connecting terminal 24 fits, and penetrates and fills the clearance between the external connecting terminal 24 and the terminal hole 41. The solder 50, which is the solder 51 solidified after filling the clearance between the external connecting terminal 24 and the terminal hole 41, provides a bond between the external connecting terminal 24 and the terminal hole 41, as illustrated in FIG. 5A.

Figure 13A:
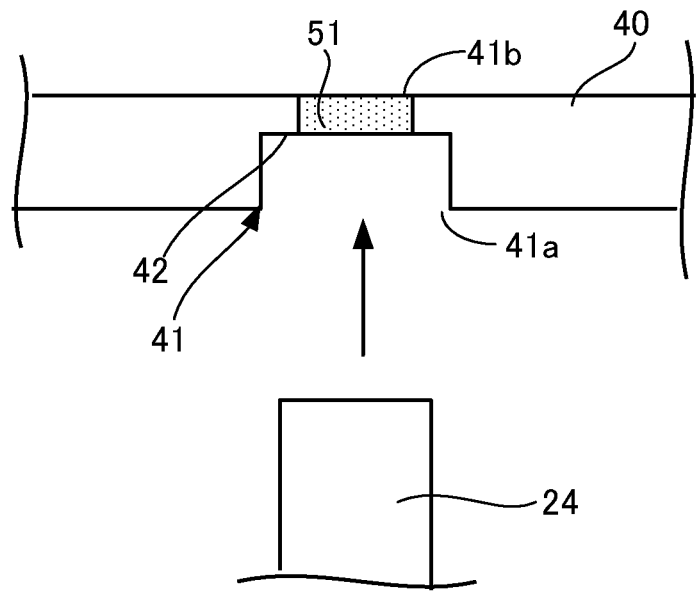
FIGS. 13A and 13B illustrate a second part of the methods of joining the external connecting terminal to the conducting board according to the first embodiment.
Figure 13B:
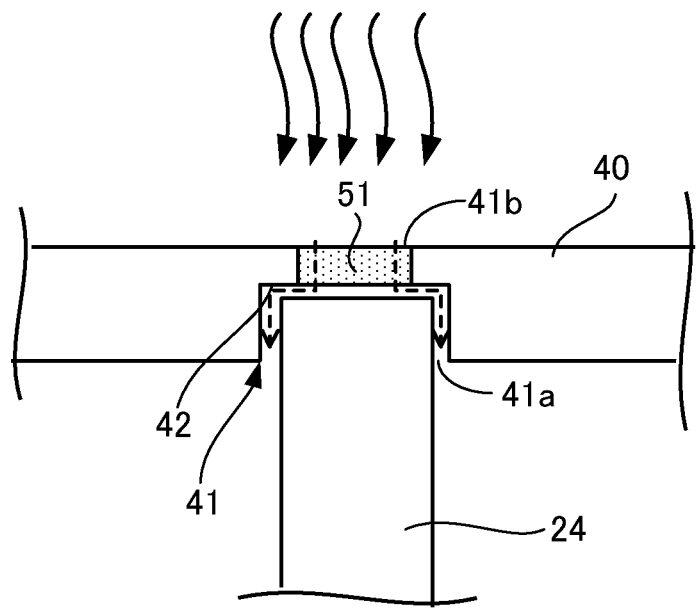

Next described is a joining method different from that depicted in FIGS. 12A and 12B, with reference to FIGS. 13A and 13B. After the semiconductor modules 10 and the conducting boards 40 are prepared as mentioned above, the conducting boards 40 are set such that the terminal holes 41 on the conducting boards 40 oppose the external connecting terminals 24. Let us refer to FIG. 13A where the solder 51 is disposed to block the outlet 41b of the terminal hole 41. Note that the solder 51 may be disposed to block the outlet 41b of the terminal hole 41 on the conducting boards 40 first, which is then followed by setting the conducting board 40 to oppose the external connecting terminal 24. Subsequently, the second end of the external connecting terminal 24 is inserted into the terminal hole 41 on the conducting board 40 from the inlet 41a until it abuts against the stepped portion 42 in the terminal hole 41. At this time, the external connecting terminal 24 fits into the conducting board 40 without penetrating through it.

In this condition, the solder 51 is melted by heat, for example, using a soldering iron. As illustrated in FIG. 13B, the melted solder 51 flows from the outlet 41b of the conducting board 40 into the terminal hole 41, into which the external connecting terminal 24 fits, and penetrates and fills the clearance between the external connecting terminal 24 and the terminal hole 41. The solder 50, which is the solder 51 solidified after filling the clearance between the external connecting terminal 24 and the terminal hole 41, provides a bond between the external connecting terminal 24 and the terminal hole 41, as illustrated in FIG. 5A.

Figure 14A:
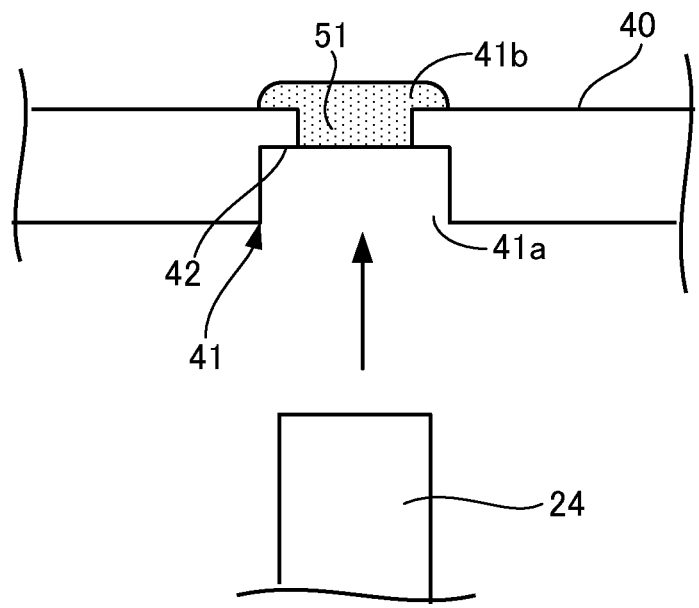
FIGS. 14A and 14B illustrate a third part of the methods of joining the external connecting terminal to the conducting board according to the first embodiment.
Figure 14B:
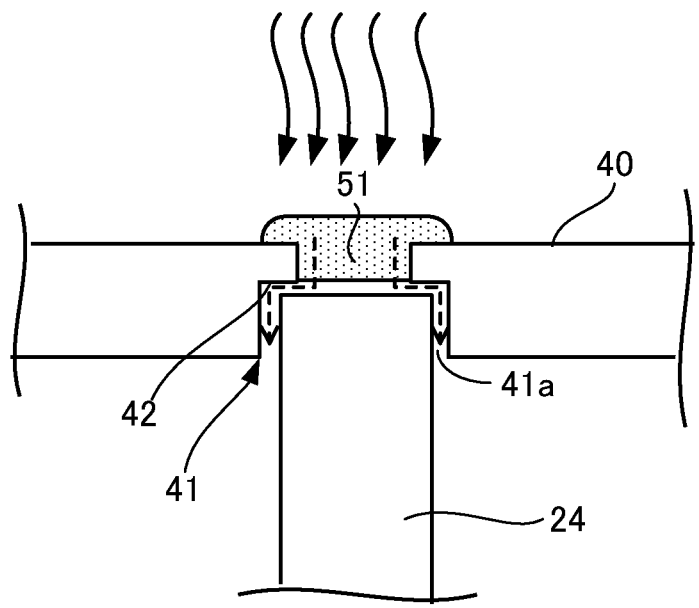

Next described is a joining method different from that depicted in FIGS. 13A and 13B, with reference to FIGS. 14A and 14B. After the semiconductor modules 10 and the conducting boards 40 are prepared as mentioned above, the conducting boards 40 are set such that the terminal holes 41 on the conducting boards 40 oppose the external connecting terminals 24. Let us refer to FIG. 14A where the solder 51 is disposed at the outlet 41b of the terminal hole 41 to block it as well as over the outlet 41b. Note that, in this case also, the solder 51 may be disposed on the conducting board 40 first, which is then followed by setting the conducting board 40 to oppose the external connecting terminal 24. Subsequently, the second end of the external connecting terminal 24 is inserted into the terminal hole 41 on the conducting board 40 from the inlet 41a until it abuts against the stepped portion 42 in the terminal hole 41. At this time, the external connecting terminal 24 fits into the conducting board 40 without penetrating through it.

In this condition, the solder 51 is melted by heat, for example, using a soldering iron. As illustrated in FIG. 14B, the melted solder 51 flows from the outlet 41b of the conducting board 40 into the terminal hole 41, into which the external connecting terminal 24 fits, and penetrates and fills the clearance between the external connecting terminal 24 and the terminal hole 41. In the case of FIGS. 14A and 14B, the solder 51 is provided not only to block the outlet 41b of the terminal hole 41 on the conducting board 40, but also over the outlet 41b. The increased amount of solder 51 further ensures that the solder 51 penetrates and fills the entire clearance between the external connecting terminal 24 and the terminal hole 41, compared with the case of FIGS. 13A and 13B. Note that the amount of the solder 51 melted and filling the clearance is controlled by appropriately adjusting the amount of the solder 51 disposed over the outlet 41b. Thus, the solder 50, which is the solder 51 solidified after filling the clearance between the external connecting terminal 24 and the terminal hole 41, provides a secure bond between the external connecting terminal 24 and the terminal hole 41, as illustrated in FIG. 5A.

Figure 15:
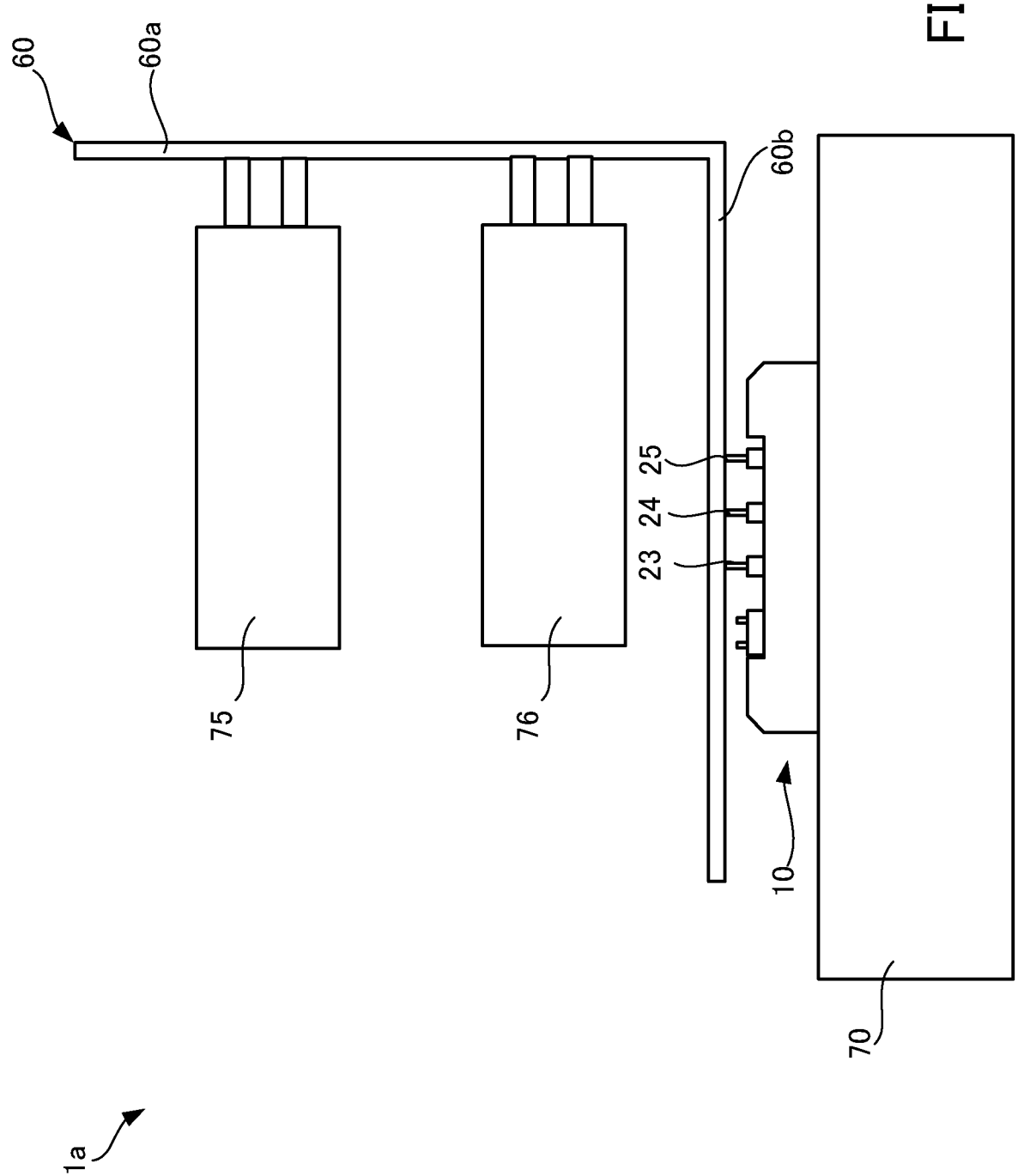
FIG. 15 illustrates a first exemplary semiconductor device according to the first embodiment.
Figure 16:
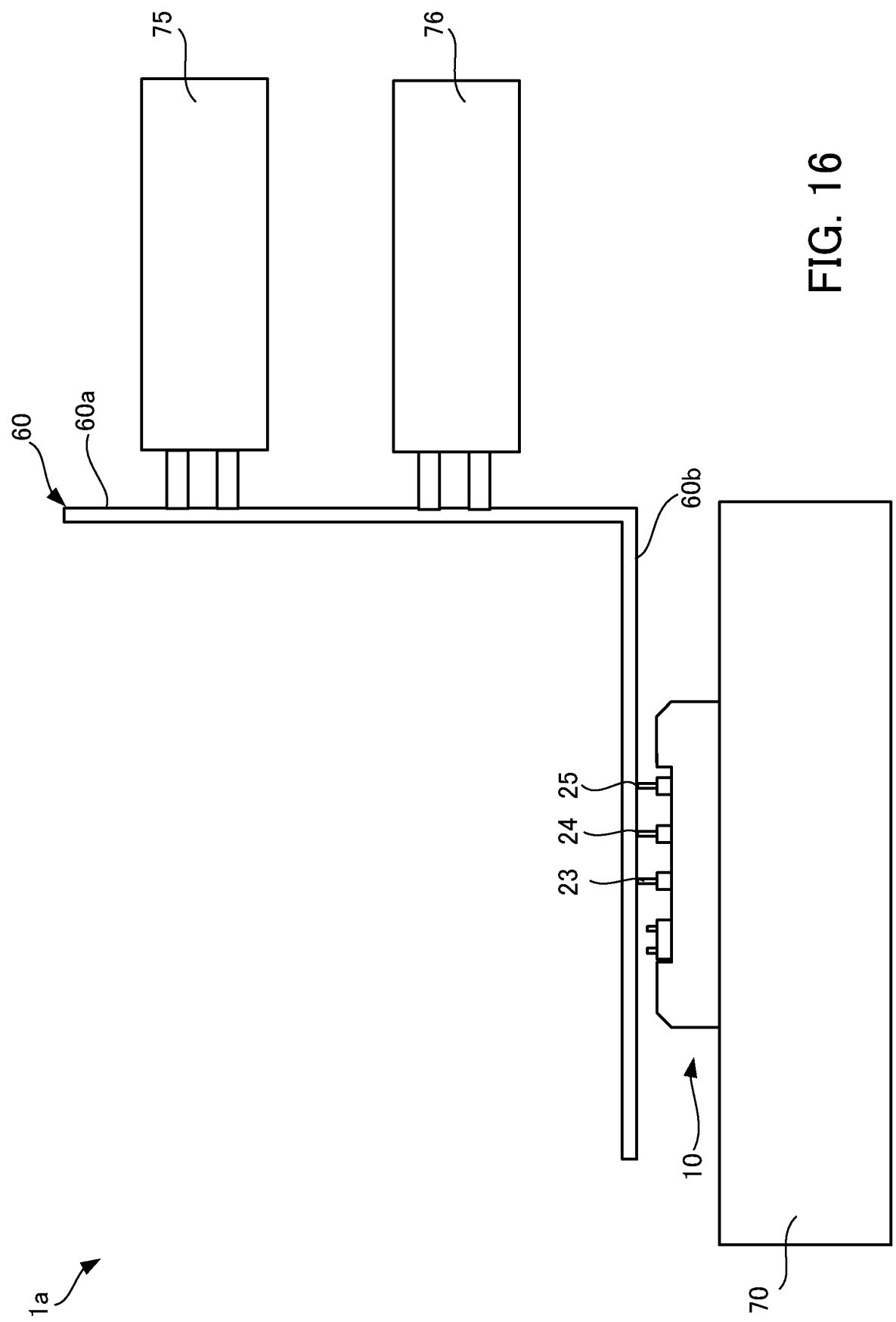
FIG. 16 illustrates a second exemplary semiconductor device according to the first embodiment.

Next described are specific examples of semiconductor devices including conducting boards to which external connecting terminals are joined without penetrating through the conducting boards, as described above, with reference to FIGS. 15 and 16. FIGS. 15 and 16 illustrate exemplary semiconductor devices according to the first embodiment.

A semiconductor device 1a includes a plurality of semiconductor modules 10, capacitors 75 and 76, and a cooler 70, as illustrated in FIG. 15. The semiconductor modules 10 and the capacitors 75 and 76 are electrically connected to each other via a busbar 60. The semiconductor device 1a further includes a gate drive unit (not illustrated). Note that FIG. 15 depicts only one of the semiconductor modules 10 because it is a side view of the semiconductor device 1a.

The multiple semiconductor modules 10 may be disposed on the cooler 70. These semiconductor modules 10 individually include, as mentioned above, the first semiconductor chip 14, the second semiconductor chip 15, the third semiconductor chip 16, and the fourth semiconductor chip 17 to function as a two-level inverter. The capacitors 75 and 76 are smoothing capacitors for attenuating ripple current caused by switching of the first semiconductor chip 14 and the third semiconductor chip 16. The busbar 60 includes a first face 60a and a second face 60b orthogonally and integrally connected to the first face 60a. The capacitors 75 and 76 are electrically connected to the inside of the first face 60a (on the same side as the semiconductor modules 10), and the second ends of the external connecting terminals 23, 24, and 25 extending from the semiconductor modules 10 are joined to the rear surface of the second face 60b. Note that the gate drive unit isolates a control signal input thereto, and converts the isolated control signal, e.g. a pulse width modulation (PWM) signal, into a gate signal for driving the semiconductor modules 10 and then outputs the gate signal.

Thus, according to the semiconductor device 1a, the external connecting terminals 23, 24, and 25 of the semiconductor modules 10 are affixed without protruding from the second face 60b of the busbar 60, as in the cases of FIGS. 5 to 11. This eases limitations on space above the second face 60b of the busbar 60. As a result, it is possible to locate the capacitors 75 and 76 close to the second face 60b when installing them on the first face 60a of the busbar 60. This in turn allows a reduction in the height of the semiconductor device 1a, thus resulting in downsizing of the semiconductor device 1a.

In the semiconductor device 1a, the capacitors 75 and 76 may be installed on the outside of the first face 60a (on the side opposite to the semiconductor modules 10), as illustrated in FIG. 16. The placement of the capacitors 75 and 76 eases limitations on space above the second face 60b of the busbar 60 in the semiconductor device 1a. This allows, for example, manual procedures and tasks using tools to be performed from the right hand direction in FIG. 16, thus increasing the workability of the semiconductor device 1a.

(b) Second Embodiment

Figure 17A:
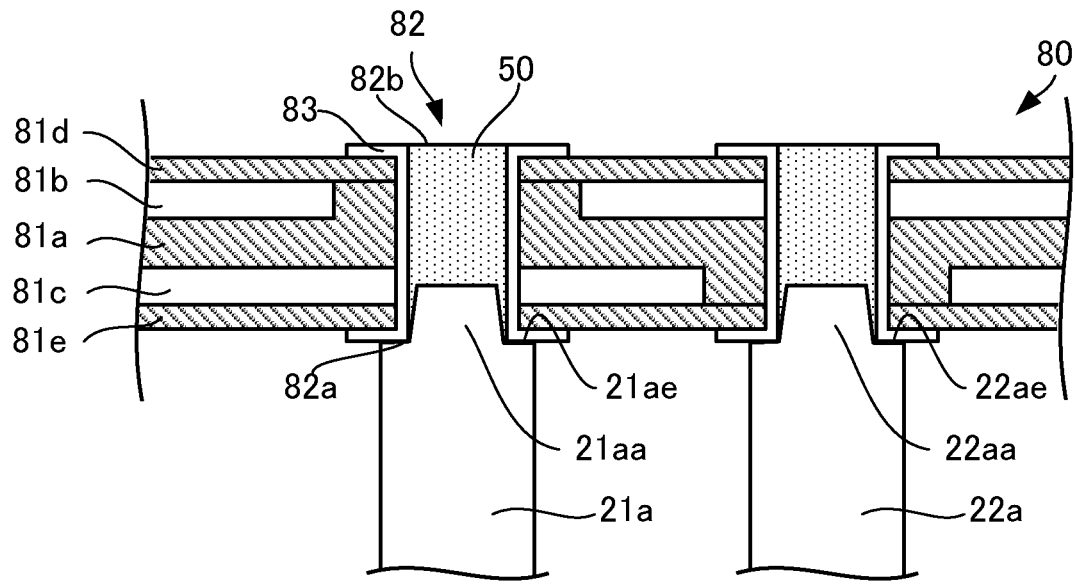
FIGS. 17A and 17B illustrate joining of external connecting terminals to a printed board according to a second embodiment.
Figure 17B:
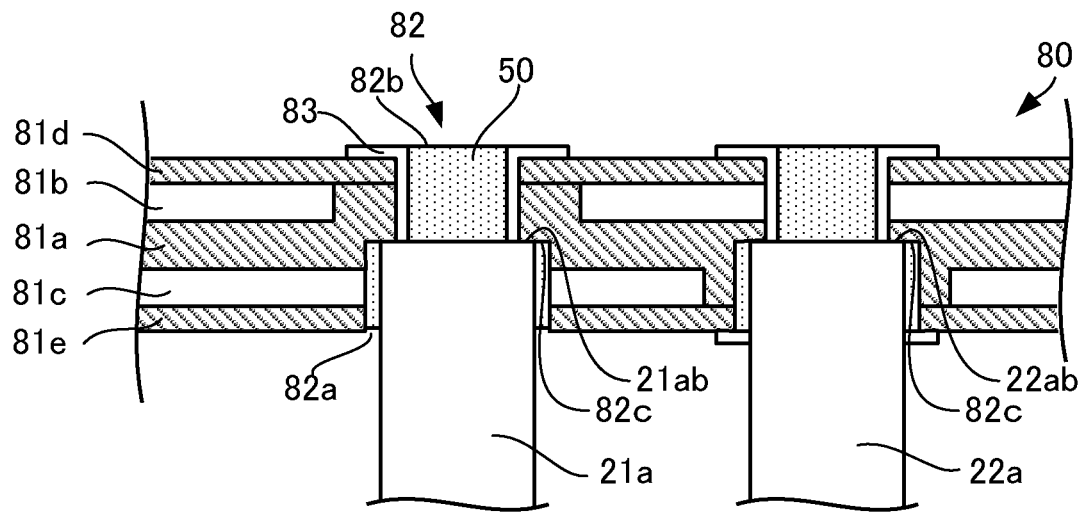

A second embodiment is described next with an example where a printed board is used as a conducting board, with reference to FIGS. 17A and 17B. FIGS. 17A and 17B illustrate joining of external connecting terminals to the printed board according to the second embodiment. Each of FIGS. 17A and 17B is a cross-sectional view along dashed-dotted line Z-Z of FIG. 4A. Note however that FIGS. 17A and 17B illustrate different configurations of the printed board. The second embodiment below describes, as an example, the case of the external connecting terminals 21a and 22a, which are control terminals, amongst the external connecting terminals of the semiconductor modules 10.

A printed board 80 is a double-sided printed board including two conducting layers 81b and 81c. The printed board 80 includes an insulating layer 81a and the conducting layers 81b and 81c individually disposed on the front and the rear surfaces of the insulating layer 81a. Protecting layers 81d and 81e are disposed on the surfaces of the individual conducting layers 81b and 81c. Further, in the printed board 80, through holes 82 are formed, each penetrating through the printed board 80 from an inlet 82a on the rear surface to an outlet 82b on the front surface.

As illustrated in FIG. 17A, the through holes 82 are hollow and have a columnar shape with no projection or stepped portion formed around their inner peripheries. The inlet 82a and the outlet 82b of each through hole 82 oppose each other, and have the same shape and opening area. In the through holes 82 into which the external connecting terminals 21a and 22a fit, the conducting layers 81b and 81c may be exposed from the inner wall surfaces thereof. Plating 83 made of metal may be applied to the inner wall surfaces of the through holes 82 to cover the conducting layers 81b and 81c exposing from the inner wall surfaces. In the left-hand through hole 82 of FIG. 17A, the conducting layer 81c on the inlet 82a side, exposed from the inner wall surface of the through hole 82, is covered by the plating 83 and thus electrically connected to the plating 83. On the other hand, the conducting layer 81b on the outlet 82b side is not exposed from the inner wall surface of the through hole 82 and is therefore electrically insulated from the plating 83. In the right-hand through hole 82 of FIG. 17A, the conducting layer 81c on the inlet 82a side is not exposed from the inner wall surface of the through hole 82 and is therefore electrically insulated from the plating 83. On the other hand, the conducting layer 81b on the outlet 82b side, exposed from the inner wall surface of the through hole 82, is covered by the plating 83 and thus electrically connected to the plating 83.

Next described is how to join the above-described printed board 80 to the external connecting terminals 21a and 22a of the semiconductor modules 10. The external connecting terminals 21a and 22a have projections 21aa and 22aa surrounded by stepped portions 21ae and 22ae formed on the peripheral edges of the tip faces. These projections 21aa and 22aa of the external connecting terminals 21a and 22a fit into the through holes 82 via the solder 50 while the stepped portions 21ae and 22ae formed on the peripheral edges of the external connecting terminals 21a and 22a abut against the rims of the inlets 82a of the through holes 82 on the printed board 80. In addition, the external connecting terminals 21a and 22a are joined to the through holes (the left- and right-hand through holes of FIG. 17A) which are individually electrically connected to the different conducting layers 81c and 81b. In this manner, the external connecting terminals 21a and 22a are joined to the through holes 82 on the printed board 80. The second ends of the external connecting terminals 21a and 22a remain inside the through holes 82. Herewith, the external connecting terminals 21a and 22a are individually electrically connected to the conducting layers 81c and 81b without penetrating through the printed board 80. In addition, it is possible to join the multiple external connecting terminals 21a and 22a to the individual conducting layers 81c and 81b of the multilayer laminated substrate formed of a plurality of conducting layers stacked one on top of the other.

In the printed board 80, stepped portions 82c may be formed between the inlets 82a and the outlets 82b of the through holes 82 by drilling the printed board 80 from the inlet 82a side of the through holes 82 up to the insulating layer 81a, as illustrated in FIG. 17B. The stepped portions 82c are formed to surround the inner peripheries of the through holes 82. The second ends of the external connecting terminals 21a and 22a being columnar in shape fit into the individual through holes 82. In this case, peripheral edges 21ab and 22ab of the tip faces of the second ends of the external connecting terminals 21a and 22a abut against the stepped portions 82c, and the external connecting terminals 21a and 22a are fixed by the solder 50 sealing the clearance between the external connecting terminals 21a and 22a and the through holes 82. In this manner, the second ends of the external connecting terminals 21a and 22a remain inside the through holes 82. Accordingly, the external connecting terminals 21a and 22a are electrically connected to the conducting layers 81c and 81b without penetrating through the printed board 80. In addition, it is possible to join the multiple external connecting terminals 21a and 22a to the individual conducting layers 81c and 81b of the multilayer laminated substrate formed of a plurality of conducting layers stacked one on top of the other. Note that the external connecting terminals 21a and 22a may individually have the projection 24a formed on their tip faces, as in the case of FIG. 7A.

Note that, in order to join the external connecting terminals 21a and 22a to the printed board 80 illustrated in FIGS. 17A and 17B, each of the methods represented in FIGS. 12 to 14 according to the first embodiment is applicable as needed, and the shape of the second ends of the external connecting terminals 21a and 22a is changed according to the applied method. In addition, the methods illustrated in FIGS. 12 to 14 in the first embodiment are applicable not only to the case where the printed board 80 is a double-sided printed board but also to cases where the printed board 80 is a single-sided printed board or a multilayer printed board. The shape of the second ends of the external connecting terminals 21a and 22a may be changed according to an applied method.

(c) Third Embodiment

Figure 18:
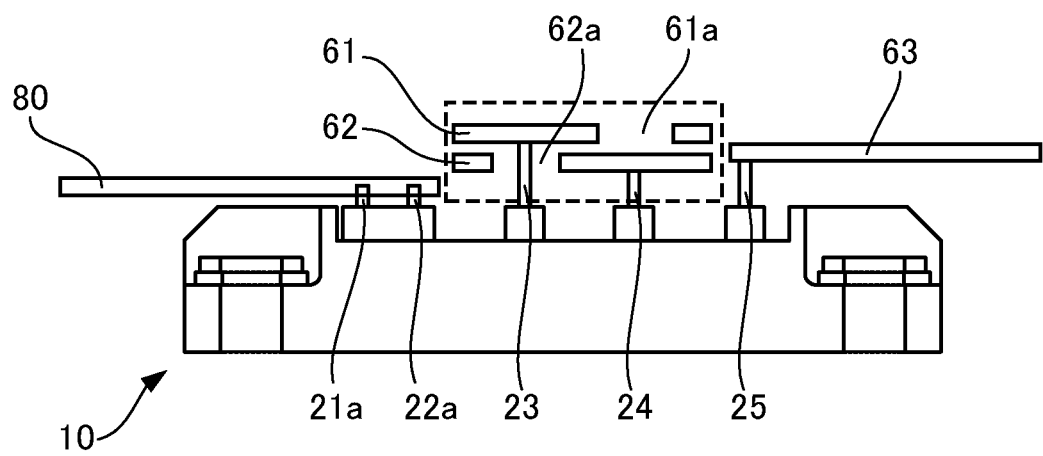
FIG. 18 is a first diagram illustrating a plurality of semiconductor modules to which busbars are affixed according to a third embodiment.
Figure 19:
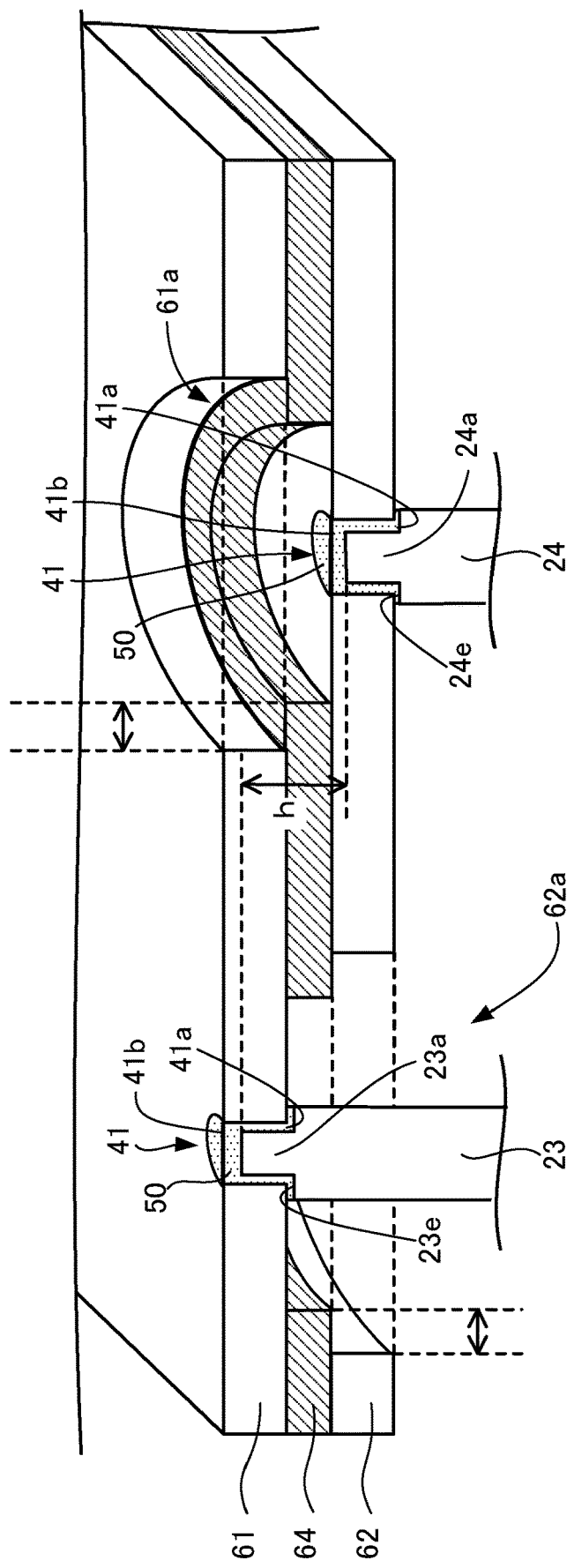
FIG. 19 is a first diagram illustrating joining of external connecting terminals to the busbars according to the third embodiment.
Figure 20:
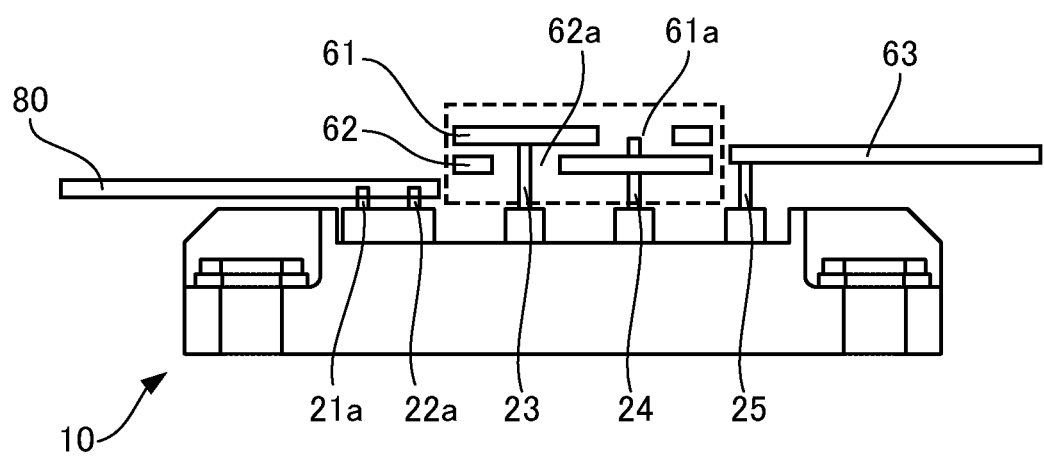
FIG. 20 is a second diagram illustrating the plurality of semiconductor modules to which the busbars are affixed according to the third embodiment.
Figure 21:
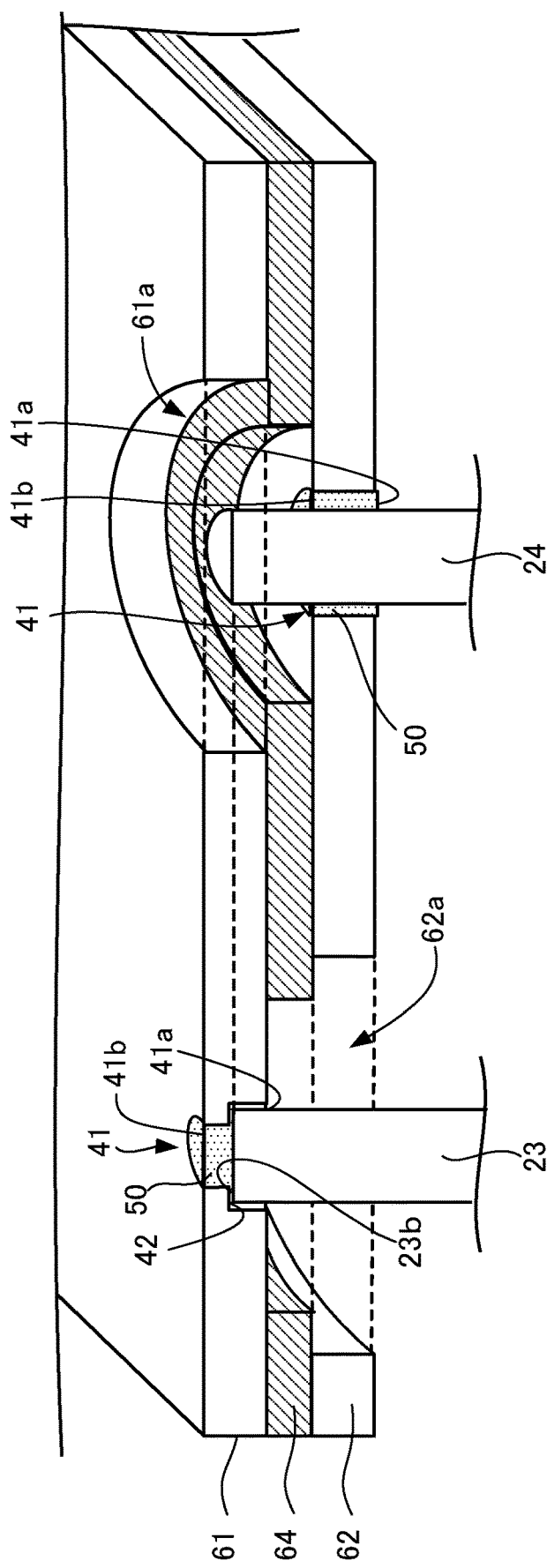
FIG. 21 is a second diagram illustrating joining of the external connecting terminals to the busbars according to the third embodiment.
Figure 22:
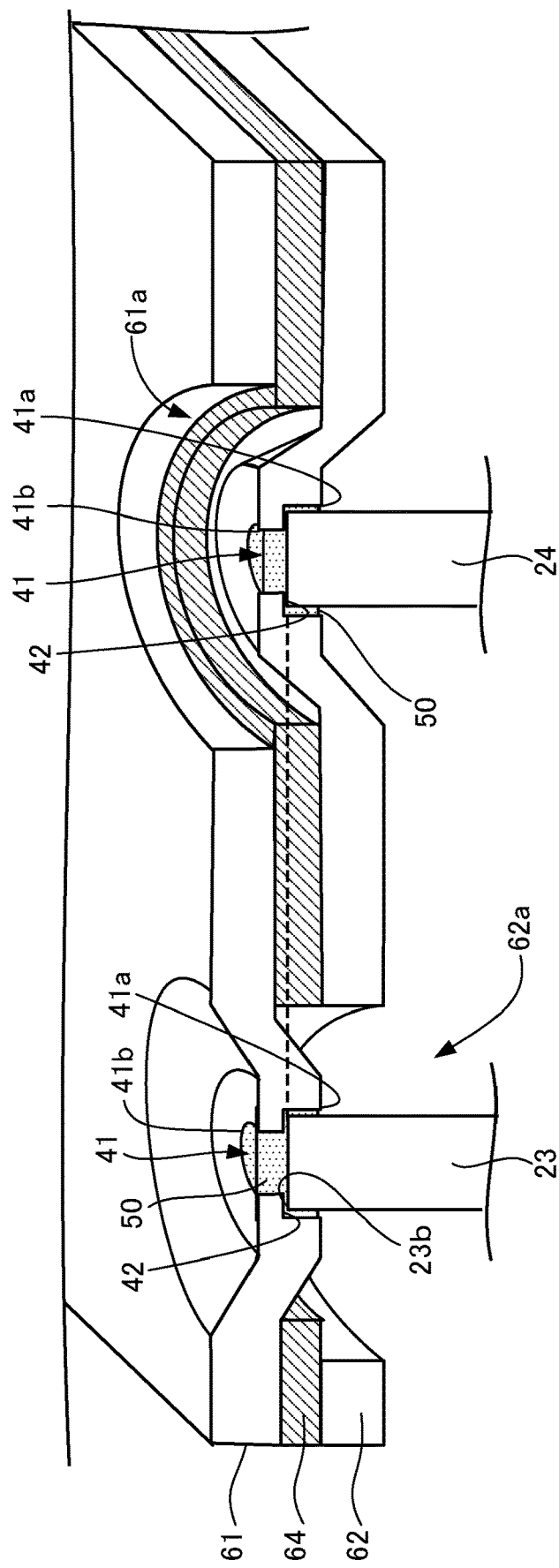
FIG. 22 is a third diagram illustrating joining of the external connecting terminals to the busbars according to the third embodiment.

A third embodiment is directed to the case where two conducting boards stacked one on top of the other are set on the semiconductor modules 10, with reference to FIGS. 18 to 22. FIGS. 18 to 20 illustrate a plurality of semiconductor modules with busbars affixed thereto according to the third embodiment. FIGS. 19, 21, and 22 illustrate joining of external connecting terminals to the busbars according to the third embodiment. Note that FIGS. 19, 21, and 22 are enlarged views of regions enclosed by dashed lines in FIGS. 18 and 20.

A semiconductor device includes a conducting board 61 corresponding to a positive input board, a conducting board 62 corresponding to a negative input board, a conducting board 63 corresponding to an output board, and the printed board 80 corresponding to a control board, as illustrated in FIG. 18. The conducting boards 61 to 63 and the printed board 80 are in the form of flat plates. The conducting boards 61 and 62 are stacked one on top of the other via insulating substrate 64 (to be described later). The conducting boards 61 to 63 are affixed to the external connecting terminals 23 to 25 of the multiple semiconductor modules 10 such that the second ends (tip faces) of the external connecting terminals 23 to which the conducting board 61 is affixed are located higher than the second ends (tip faces) of the external connecting terminals 24 to which the conducting board 62 is affixed. In addition, on the conducting board 61, upper apertures 61a are formed at regions corresponding to the external connecting terminals 24. On the other hand, on the conducting board 62, lower apertures 62a are formed which allow the external connecting terminals 23 to pass therethrough without coming in contact with the conducting board 62. Further, the second ends (tip faces) of the external connecting terminals 25 are located at the same level in height or lower than the second ends (tip faces) of the external connecting terminals 23. The conducting board 63 is located at the same level in height or lower than the conducting board 61.

On the conducting boards 61 and 62, the terminal holes 41 are formed into which the external connecting terminals 23 and 24 fit, as illustrated in FIG. 19. As in the case of FIG. 6A, the terminal holes 41 are formed on the individual conducting boards 61 and 62 such that they penetrate through the conducting boards 61 and 62 from the inlets 41a on the rear surfaces to the outlets 41b on the opposite front surfaces. In addition, stepped portions 23e and 24e are formed on the peripheral edges of the tip faces of the second ends of the external connecting terminals 23 and 24. In this case, projections 23a and 24a of the external connecting terminals 23 and 24 fit into the terminal holes 41 via the solder 50. At the same time, the stepped portions 23e and 24e of the external connecting terminals 23 and 24 abut against the rims of the inlets 41a of the terminal holes 41. The external connecting terminals 23 and 24 are fixed by the solder 50 sealing the clearance between the external connecting terminals 23 and 24 and the terminal holes 41. Therefore, the external connecting terminal 24 is electrically connected to the conducting board 62 without penetrating through it. Similarly, the external connecting terminal 23 is electrically connected to the conducting board 61 without penetrating through it. Thus, the external connecting terminals 23 and 24 of the semiconductor modules 10 are affixed without protruding from the conducting board 61, which eases limitations on space above the conducting board 61. Similarly, the external connecting terminal 25 is electrically connected to the conducting board 63 without penetrating through it. In this case, the conducting boards 61 and 62 remain insulated from each other by the insulating substrate 64 sandwiched between the two. The upper aperture 61a and the lower aperture 62a are individually located with enough distance from the external connecting terminals 24 and 23. The insulating substrate 64 has through holes at regions each encompassing its corresponding terminal hole 41. The through holes on the insulating substrate 64 are larger than the terminal holes 41, and preferably have diameters larger than the outer diameters of the individual external connecting terminals 23 and 24. In addition, the upper aperture 61a and the lower aperture 62a are formed at regions each encompassing its corresponding through hole on the insulating substrate 64. The through holes on the insulating substrate 64 are preferably smaller than the upper apertures 61a and the lower apertures 62a. Herewith, it is possible to maintain sufficient creepage distance from the external connecting terminals 23 and 24.

On the other hand, an example depicted in FIG. 20 may also be adoptable in order to affix the external connecting terminals 23 to 25 of the semiconductor modules to the conducting boards 61 to 63 such that the external connecting terminals 23 to 25 do not protrude from them. In the example of FIG. 20, the conducting boards 61 to 63 are affixed to the multiple semiconductor modules 10 such that the tip faces of the external connecting terminals 23 to which the conducting board 61 is affixed are located at the same level in height as the tip faces of the external connecting terminals 24 to which the conducting board 62 is affixed. In addition, as in the case of FIG. 18, the conducting board 61 has the upper apertures 61a formed in regions corresponding to the external connecting terminals 24. On the other hand, the conducting board 62 has the lower apertures 62a, which allow the external connecting terminals 23 to pass therethrough without coming in contact with the conducting board 62. Further, the second ends (tip faces) of the external connecting terminals 25 are located at the same level in height or lower than the second ends (tip faces) of the external connecting terminals 23. The conducting board 63 is located at the same level in height or lower than the conducting board 61.

On the conducting boards 61 and 62, the terminal holes 41 are formed into which the external connecting terminals 23 and 24 fit, as illustrated in FIG. 21. In this case, the conducting board 61 and the external connecting terminals 23 may be joined to each other in the same manner as illustrated in FIG. 5A. The terminal holes 41 are formed on the conducting board 61 such that they penetrate through the conducting board 61 from the inlets 41a on the rear surface to the outlets 41b on the opposite front surface. In addition, each terminal hole 41 has the stepped portion 42 between the inlet 41a and the outlet 41b. In this case, the peripheral edges of the tip faces of the second ends of the external connecting terminals 23 abut against the stepped portions 42, and the external connecting terminals 23 are fixed within the terminal holes 41 by the solder 50 sealing the clearance between the external connecting terminals 23 and the terminal holes 41. Accordingly, the external connecting terminals 23 are electrically connected to the conducting board 61 without penetrating through it. By employing the same configuration, the external connecting terminals 25 are also electrically connected to the conducting board 63 without penetrating through it. On the other hand, the conducting board 62 and the external connecting terminals 24 are joined to each other in the terminal holes 41 each having a columnar shape, as illustrated in FIG. 21. The straight external connecting terminals 24 are inserted into the terminal holes 41 on the conducting board 62 and set such that their tip faces are located lower in height than the front surface of the conducting board 61. The external connecting terminals 24 are then fixed to the terminal holes 41 by the solder 50. Thus, the external connecting terminals 23 and 24 of the semiconductor modules 10 are affixed without protruding from the conducting board 61, which eases limitations on space above the conducting board 61. In this case, the conducting boards 61 and 62 remain insulated from each other by the insulating substrate 64 sandwiched between the two. The upper apertures 61a and the lower apertures 62a are individually located with enough distance from the external connecting terminals 24 and 23. Herewith, it is possible to maintain sufficient creepage distance from the external connecting terminals 23 and 24.

FIG. 22 depicts a modification of the example of FIG. 21. Within the conducting boards 61 and 62, regions including parts to which the external connecting terminals 23 and 24 are joined individually sink in toward the lower aperture 62a side and the upper aperture 61a side. Specifically, in the conducting board 61 located higher within the laminated structure, regions each including a part to which the external connecting terminal 23 is joined sink in toward the lower aperture 62a side. That is, depressions with the terminal holes 41 recessed toward the lower aperture 62a side are formed on the conducting board 61. On the other hand, in the conducting board 62 located lower within the laminated structure, regions each including a part to which the external connecting terminal 24 is joined sink in toward the upper aperture 61a side. That is, depressions with the terminal holes 41 recessed toward the upper aperture 61a side are formed on the conducting board 62. In addition, the tip faces of the external connecting terminals 23 which are joined to the conducting board 61 and those of the external connecting terminals 24 which are joined to the conducting board 62 are set on the same level. In this case, joining of the conducting board 61 and the external connecting terminals 23 and joining of the conducting board 62 and the external connecting terminals 24 are made in the same manner as depicted in FIG. 5A. The terminal holes 41 are formed on the two conducting boards 61 and 62 such that they penetrate through the individual conducting boards 61 and 62 from the inlets 41a on the rear surfaces to the outlets 41b on the opposite front surfaces. In addition, each terminal hole 41 has the stepped portion 42 between the inlet 41a and the outlet 41b. In this case, the peripheral edges of the tip faces of the second ends of the external connecting terminals 23 and 24 individually abut against the stepped portions 42, and the external connecting terminals 23 and 24 are fixed within the corresponding terminal holes 41 by the solder 50 sealing the clearance between the external connecting terminals 23 and 24 and the terminal holes 41. Accordingly, the external connecting terminals 23 and 24 are electrically connected to the conducting boards 61 and 62 without penetrating through them. Note that the depressions may be formed on at least one of the conducting boards 61 and 62. In addition, the tip faces of the external connecting terminals 23 may be set on a higher level in height than those of the external connecting terminals 24.

The conducting boards 61 to 63 and the external connecting terminals 23, 24, and 25 of FIGS. 18 to 22 may adopt the configurations illustrated in FIGS. 5 to 11 according to the first embodiment. In addition, in order to join the external connecting terminals 23, 24, and 25 to the conducting boards 61 to 63 of FIGS. 18 to 22, the methods depicted in FIGS. 12 to 14 according to the first embodiment may be adopted. In the case where insulation coating has been applied, for example, to the surfaces of the conducting boards 61 to 63 of FIGS. 18 to 22, the areas of the upper apertures 61a and the lower apertures 62a may be reduced compared with the cases of FIGS. 18 to 22. Note that the conducting board 63 to which the external connecting terminals 25 (O terminals) are joined may be laminated in the same manner as the conducting boards 61 and 62, to which the external connecting terminals 23 and 24 (P and N terminals) are joined, and stacked in layers together with the conducting boards 61 and 62. In this case, the external connecting terminals 25 may be joined in the same manner as the external connecting terminals 23 and 24. Other suitable wiring patterns and joining configurations may be adopted depending, for example, on the type of the circuit.

(d) Fourth Embodiment

Figure 23:
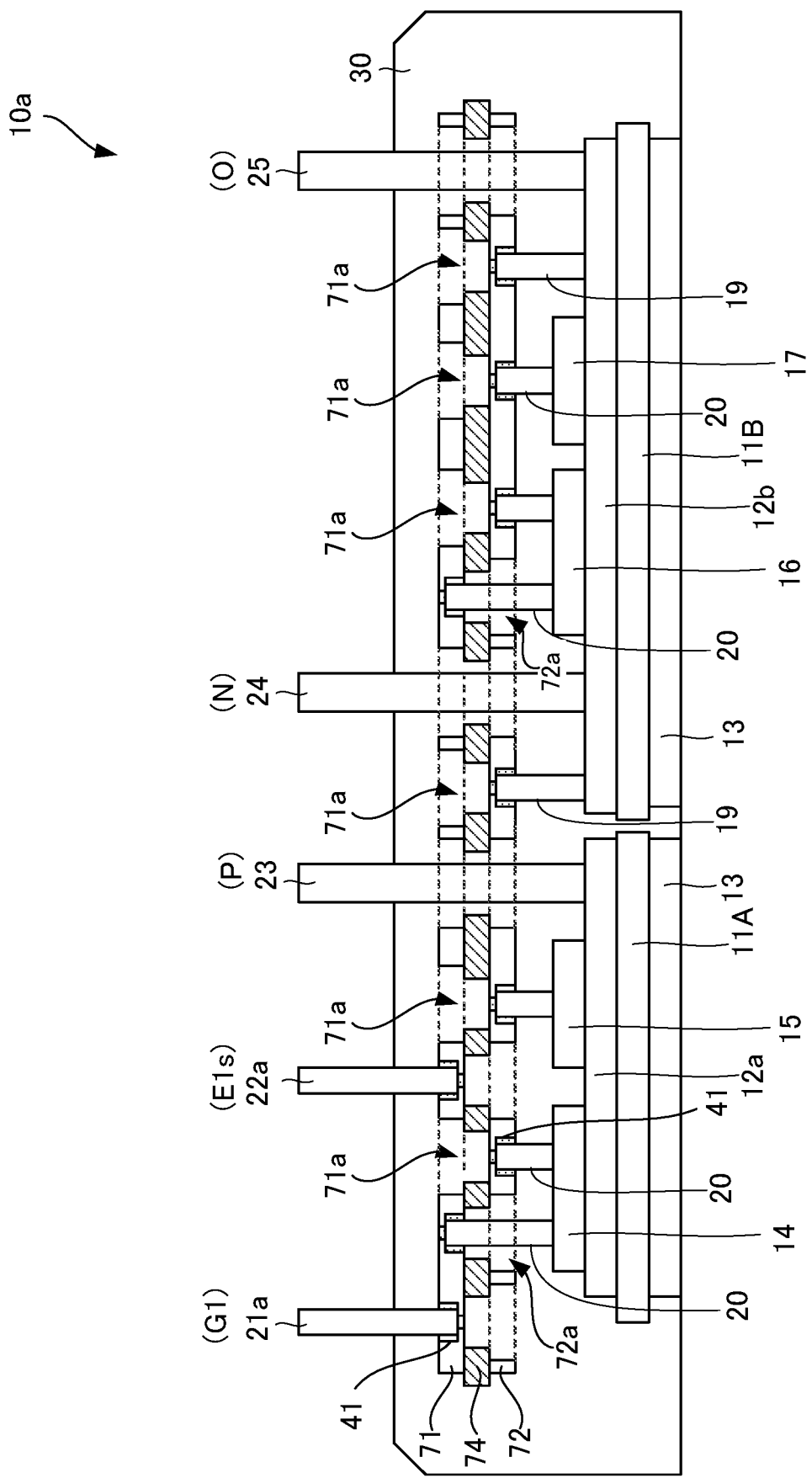
FIG. 23 is a cross-sectional view of a semiconductor module according to a fourth embodiment.

The first to third embodiments are described above with examples of affixing conducting boards to external connecting terminals extending from the semiconductor modules 10. A fourth embodiment is directed to the conducting boards connected within a semiconductor module, with reference to FIG. 23. FIG. 23 is a cross-sectional view of a semiconductor module according to the fourth embodiment. Note that, as for components included in a semiconductor module 10a of FIG. 23, like reference numerals are given to like components to those of the above-described semiconductor module 10 and the like and, thus, the repeated description is herein omitted. The semiconductor module 10a has the same functions as the semiconductor module 10.

The semiconductor module 10a includes the first to fourth semiconductor chips 14 to 17; the sealing unit 30 for sealing the first to fourth semiconductor chips 14 to 17 therein; the conductive posts 19 and 20 for electrically connecting to the first to fourth semiconductor chips 14 to 17, the first circuit board 12a, and the second circuit board 12b in the sealing unit 30; and the external connecting terminals 21a, 21b, 22a, 22b, 23, 24, and 25. Note that the external connecting terminals 21b and 22b are not illustrated in FIG. 23. The semiconductor module 10a also includes the first insulating substrate 11A and the second insulating substrate 11B placed side-by-side in a horizontal direction. As for the first insulating substrate 11A, the first circuit board 12a is placed on its upper surface, and the metal plate 13 having the same thickness as the first circuit board 12a is placed on its rear surface. As for the second insulating substrate 11B, the second circuit board 12b is placed on its upper surface, and the metal plate 13 having the same thickness as the second circuit board 12b is placed on its rear surface. Further, a plurality of third circuit boards is placed on the upper surfaces of the first insulating substrate 11A and the second insulating substrate 11B. The metal plates 13 are exposed from the rear surface of the sealing unit 30, as illustrated in FIG. 2.

Above the first circuit board 12a and the second circuit board 12b, conducting boards 71 and 72 are provided with insulating substrate 74 sandwiched between the two and sealed together within the sealing unit 30. Note that the conducting boards 71 and 72 and the insulating substrate 74 are in the form of flat plates as in the case of the conducting boards 61, 62, and 63 and the insulating substrate 64 of FIG. 18.

The conducting boards 71 and 72 are affixed to the conductive posts 19 and 20 of the semiconductor module 10a such that the second ends (tip faces) of the conductive posts 19 and 20 to which the conducting board 71 is affixed are set on a higher level in height than those of the conductive posts 20 to which the conducting board 72 is affixed. In addition, the conducting board 71 has upper apertures 71a formed in regions individually corresponding to the conductive posts 19 and 20 to which the conducting board 72 is affixed. On the other hand, the conducting board 72 has the lower apertures 72a, which allow the conductive posts 19 and 20 to which the conducting board 71 is affixed to pass therethrough without coming in contact with the conducting board 72.

On first major surfaces of the conducting boards 71 and 72 opposing the first circuit board 12a and the second circuit board 12b, the terminal holes 41 are formed, as in the case of the third embodiment, to which the conductive posts 19 and 20 are joined. In addition, also on a second major surface of the conducting board 71, opposite to its first major surface, the terminal holes 41 are formed, to which the external connecting terminals 21a and 22a are joined. The terminal holes 41 in FIG. 23 have the same shape as those illustrated in FIG. 5A; however, the configurations of the conducting boards 71 and 72 and the conductive posts 19 and 20 of FIG. 23 are not limited to this example and the configurations depicted in FIGS. 5B to 11 according to the first embodiment may be adopted instead, as is the case with the third embodiment. Note that the conducting boards 71 and 72 and the insulating substrate 74 have through holes through which the external connecting terminals 23, 24, and 25 pass.

The insulating substrate 74 has through holes formed at regions corresponding to the terminal holes 41, as illustrated in FIG. 23. The through holes on the insulating substrate 74 are larger than the terminal holes and preferably have diameters larger than the outer diameters of the conducting posts 19 and 20. In addition, the upper apertures 71a and the lower apertures 72a are formed at regions each encompassing its corresponding through hole on the insulating substrate 74. The through holes on the insulating substrate 74 are preferably smaller than the upper apertures 71a and the lower apertures 72a. Herewith, it is possible to maintain sufficient creepage distance from the conductive posts 19 and 20.

In the semiconductor module 10a, the conductive posts 19 and 20 to which the conducting board 72 is affixed may adopt the configuration of the external connecting terminal 24 illustrated in FIG. 21, that is, the conductive posts 19 and 20 to which the conducting board 72 is affixed run through the terminal holes 41 on the conducting board 72 and are set such that their tip faces are located on a lower level in height than the front surface of the conducting board 71. The conductive posts 19 and 20 are also fixed to the terminal holes 41 by solder. In this case also, the upper apertures 71a and the lower apertures 72a are individually located with enough distance from the conductive posts 19 and 20. Herewith, it is possible to maintain sufficient creepage distance from the conductive posts 19 and 20.

Further, in the semiconductor module 10a, the conducting boards 71 and 72 may adopt the configurations illustrated in FIG. 22, that is, within the conducting boards 71 and 72, regions including parts to which the conductive posts 19 and 20 are joined individually sink in toward the lower aperture 72a and the upper aperture 71a. Note that the depressions may be formed on at least one of the conducting boards 71 and 72. In addition, the tip faces of the conductive posts 19 and 20 to which the conducting board 71 is affixed may be set on a higher level in height than those of the conductive posts 19 and 20 to which the conducting board 72 is affixed.

Note that, although FIG. 23 illustrates the case where the external connecting terminals 21a and 22a are connected to the conducting board 71, the external connecting terminals 21a and 22a may be connected to the third circuit board as in the semiconductor module 10 of FIG. 3. In addition, the conducting boards 71 and 7 are used as lead wires and signal lead wires of a main circuit, but the embodiments are not limited thereto. In addition, although FIG. 23 illustrates the case where the insulating substrate 74 is sandwiched between two layers, namely the conducting boards 71 and 72. Alternatively, a printed board having an integrated structure of the conducting boards 71 and 72 on an insulating board may be used. In this case, the printed board may be connected to the conducting posts 19 and 20 in the same manner as described in the second embodiment. In addition, the conducting boards are not limited to having a double-layer structure, but may have a single-layer or multilayer structure.

According to one aspect, it is possible to eliminate limitations on space above front surfaces, thus enabling effective use of the space thereof or allowing downsizing.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor module, including a semiconductor chip and an external connecting terminal which has a first end electrically connected to the semiconductor chip and a second end extending from the semiconductor chip; and
a conducting board configured to have a terminal hole penetrating therethrough, an inlet and an outlet of the terminal hole being respectively on two opposite surfaces of the conducting board, the conducting board being electrically connected to the external connecting terminal, of which the second end fits into the terminal hole in a fitting direction from the inlet toward the outlet, and is fixed therein by solder, wherein
at least one of the terminal hole and the second end of the external connecting terminal has a lock part, and
the second end of the external connecting terminal is structured that, after being inserted into the terminal hole, the second end is locked by the lock part positioned between the two opposite surfaces of the conducting board, such that an endmost portion of the second end remains in the terminal hole without protruding out from the outlet, and is fixed in the terminal hole by the solder.

2. The semiconductor device according to claim 1, wherein:

the semiconductor module further includes a sealing unit that seals the semiconductor chip and the first end of the external connecting terminal therein, the second end of the external connecting terminal extends from the sealing unit, and the conducting board is set on the second end outside the sealing unit.

3. The semiconductor device according to claim 1, wherein:

the semiconductor module further includes a sealing unit that seals the semiconductor chip, the external connecting terminal, and the conducting board therein.

4. The semiconductor device according to claim 3, wherein the sealing unit seals a surface of the conducting board opposite to another surface thereof facing the semiconductor chip.

5. The semiconductor device according to claim 3, wherein:

the external connecting terminal, the conducting board and the terminal hole are respectively a first external connecting terminal, a first conducting board and a first terminal hole of the semiconductor device;

the semiconductor module further includes a second external connecting terminal which has
  a first end electrically connected to the semiconductor chip inside the sealing unit, and
  a second end extending from the sealing unit, the second external connecting terminal having a tip face at the second end thereof, and the semiconductor device further includes a second conducting board which
  is located between the first conducting board and the semiconductor module,
  has an aperture allowing the first external connecting terminal to pass therethrough, and has a terminal hole, that is a second terminal hole of the semiconductor device, penetrating therethrough, an inlet and an outlet of the second terminal hole being respectively on two opposite surfaces of the second conducting board, and
  is electrically connected to the second external connecting terminal, of which the second end fits into the second terminal hole from the inlet toward the outlet thereof, and is fixed therein by solder, and the first conducting board has another aperture formed therein at a position opposing the tip face of the second external connecting terminal.

6. The semiconductor device according to claim 5, wherein:

the lock part is a first lock part, at least one of the second terminal hole and the second end of the second external connecting terminal has a second lock part located thereon, the second end of the second external connecting terminal, inserted into the second terminal hole, is locked by the second lock part and thereby remains in the second terminal hole, and the second lock part includes at least one of a stepped portion, a taper, or a projection.

7. The semiconductor device according to claim 6, wherein:

the first external connecting terminal has, at the second end thereof, a tip face, which is higher than the tip face of the second external connecting terminal.

8. The semiconductor device according to claim 6, further comprising at least one of a first depression, which is located on the first conducting board with the first terminal hole recessed toward said aperture of the second conducting board, or a second depression, which is located on the second conducting board with the second terminal hole recessed toward said another aperture of the first conducting board.

9. The semiconductor device according to claim 5, wherein:

the first external connecting terminal has, at the second end thereof, a tip face, which is of a same height as the tip face of the second external connecting terminal, and the second external connecting terminal penetrates through the first conducting board above the second terminal hole.

10. The semiconductor device according to claim 1, wherein:

the lock part includes a stepped portion located on at least one of an inner periphery of the terminal hole and a side periphery of the second end of the external connecting terminal.

11. The semiconductor device according to claim 10, wherein:

the external connecting terminal has, at the second end thereof, a tip face that has a center and a peripheral edge, and the stepped portion and a projection are located at the peripheral edge and the center, respectively, of the tip face of the external connecting terminal.

12. The semiconductor device according to claim 11, wherein the projection is integrally formed on the tip face of the external connecting terminal.

13. The semiconductor device according to claim 1, wherein:

the lock part includes a projection, which is located at least partially along an inner periphery of the terminal hole, or at least partially along a side periphery of the second end of the external connecting terminal.

14. The semiconductor device according to claim 1, wherein:

the lock part includes a taper located on at least one of an inner periphery of the terminal hole and a side periphery of the second end of the external connecting terminal.

15. The semiconductor device according to claim 14, wherein:

the external connecting terminal has, at the second end thereof, a tip face, the taper includes a first taper located on the side periphery of the second end of the external connecting terminal, and a second taper located on the inner periphery of the terminal hole, and when the second end of the external connecting terminal fits into the terminal hole, the first taper is locked by the second taper such that the tip face of the external connecting terminal is located between the inlet and the outlet of the terminal hole.

16. A method for manufacturing the semiconductor device of claim 1, the method comprising:

preparing the semiconductor module, and the conducting board with the terminal hole penetrating therethrough, the semiconductor module including
  the semiconductor chip,
  a sealing unit for sealing the semiconductor chip therein, and the external connecting terminal which has the first end electrically connected to the semiconductor chip inside the sealing unit and the second end extending from the sealing unit;

placing the solder at at least one of the outlet and a rim of the outlet;

fitting the second end of the external connecting terminal into the terminal hole, from the inlet thereof toward the outlet; and melting the solder to fix the second end to the terminal hole with the melted solder, wherein the lock part positioned between the two opposite surfaces of the conducting board includes at least one of a stepped portion, a taper, or a projection.

17. The semiconductor device according to claim 1, wherein the external connecting terminal is a main terminal where principal current flows in and out, and the conducting board is a busbar.

18. A semiconductor device, comprising:

a semiconductor module, including a semiconductor chip and an external connecting terminal which has a first end electrically connected to the semiconductor chip and a second end extending from the semiconductor chip; and a conducting board configured to have a terminal hole penetrating therethrough, an inlet and an outlet of the terminal hole being respectively on two opposite surfaces of the conducting board, the conducting board being electrically connected to the external connecting terminal, of which the second end fits into the terminal hole in a fitting direction from the inlet toward the outlet, and is fixed therein by solder, wherein at least one of the terminal hole and the second end of the external connecting terminal has a lock part, and the second end of the external connecting terminal, inserted into the terminal hole, is locked by the lock part, such that an endmost portion of the second end remains in the terminal hole without protruding out from the outlet, and is fixed in the terminal hole by the solder, wherein:

the lock part includes a stepped portion located on at least one of an inner periphery of the terminal hole and a side periphery of the second end of the external connecting terminal, the external connecting terminal has, at the second end thereof, a tip face that has a center and a peripheral edge, the stepped portion includes a first stepped portion located on the peripheral edge of the tip face, and a second stepped portion located in the terminal hole, closer to the outlet thereof than the first stepped portion in the fitting direction and between the inlet and the outlet thereof, and when the second end of the external connecting terminal fits into the terminal hole in the fitting direction, the first stepped portion is locked by the second stepped portion with respect to the fitting direction such that the tip face of the external connecting terminal is located between the second stepped portion and the outlet of the terminal hole.

* * * * *